United States Patent [19]
Ohta et al.

[11] Patent Number: 5,229,643
[45] Date of Patent: Jul. 20, 1993

[54] SEMICONDUCTOR APPARATUS AND SEMICONDUCTOR PACKAGE

[75] Inventors: Hiroyuki Ohta; Norio Ishitsuka; Akihiro Yaguchi; Sueo Kawai, all of Ibaraki; Nobuo Owada, Ome; Shigeki Hirasawa, Ishioka, all of Japan

[73] Assignee: Hitachi, Ltd., Tokyo, Japan

[21] Appl. No.: 735,353

[22] Filed: Jul. 24, 1991

[30] Foreign Application Priority Data

Jul. 25, 1990 [JP] Japan .................. 2-194904

[51] Int. Cl.⁵ .......................................... H01L 23/48
[52] U.S. Cl. ............................. 257/706; 257/712; 257/713
[58] Field of Search .................... 357/72, 81, 71, 80

[56] References Cited

U.S. PATENT DOCUMENTS

| | | | |
|---|---|---|---|
| 4,427,993 | 1/1984 | Fichot et al. | 357/81 |
| 4,933,743 | 6/1990 | Thomas et al. | 357/72 |
| 5,003,429 | 3/1991 | Baker et al. | 357/81 |
| 5,027,191 | 6/1991 | Bourdelaise et al. | 357/80 |
| 5,045,503 | 9/1991 | Kobiki et al. | 357/81 |
| 5,053,855 | 10/1991 | Michii et al. | 357/80 |
| 5,083,188 | 1/1992 | Yamagata | 357/71 |
| 5,113,315 | 5/1992 | Capp et al. | 357/80 |

FOREIGN PATENT DOCUMENTS 1-295455  11/1989.  Japan .

Primary Examiner—Eugene R. LaRoche
Assistant Examiner—Viet Q. Nguyen
Attorney, Agent, or Firm—Antonelli, Terry, Stout & Kraus

[57] ABSTRACT

The heat transfer path (the heat radiating portion) from a position very near the semiconductor device as the heat source to the surface of the semiconductor apparatus is made of a material having a large heat conductivity thereby to more rapidly transfer the heat generated in the p-n junction to the surface of the semiconductor apparatus or the outside. This arrangement can cope with that the calorific power is increased as the integration is increased. The formation of the good heat conductive material from the surface of the apparatus to the heat source through the multilayer structure film can be attained by means of the CVD technique.

26 Claims, 11 Drawing Sheets

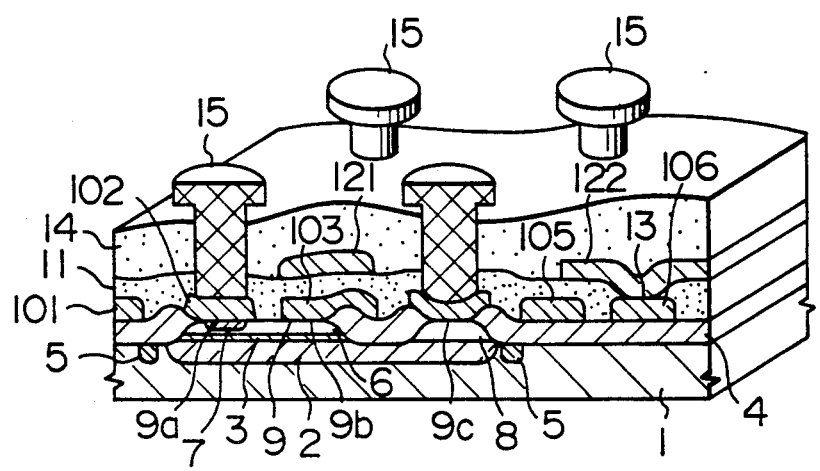
FIG. 7
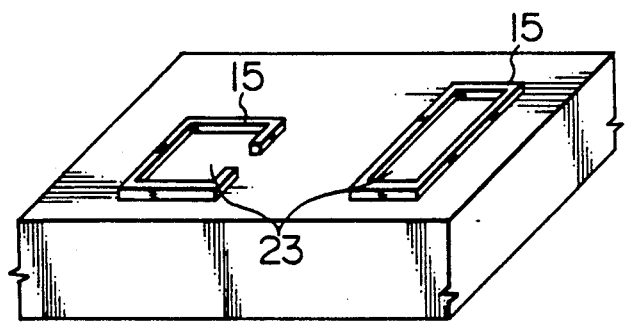
FIG. 8
FIG. 9
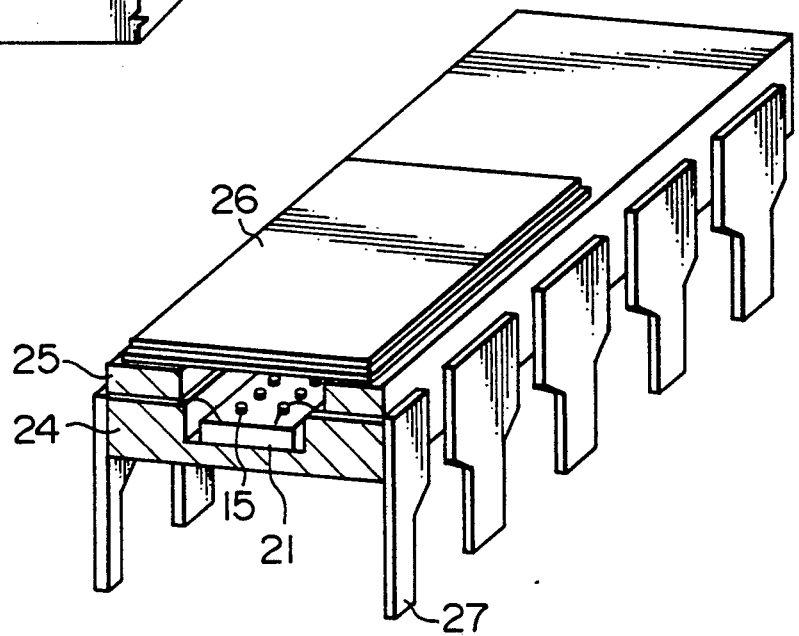

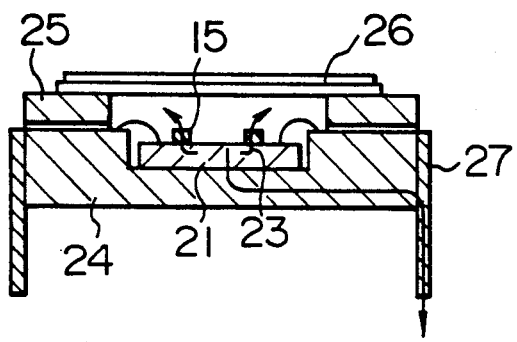
F I G. 10
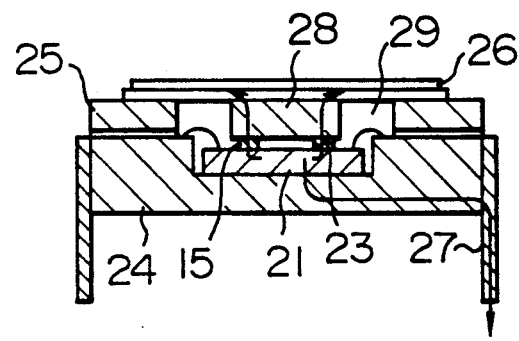
F I G. 11
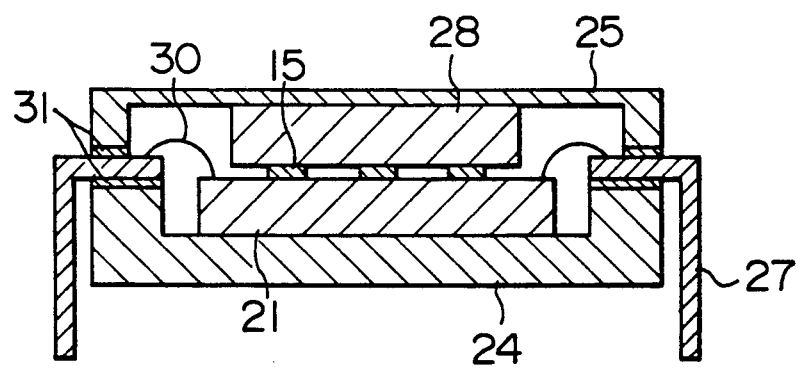
F I G. 12
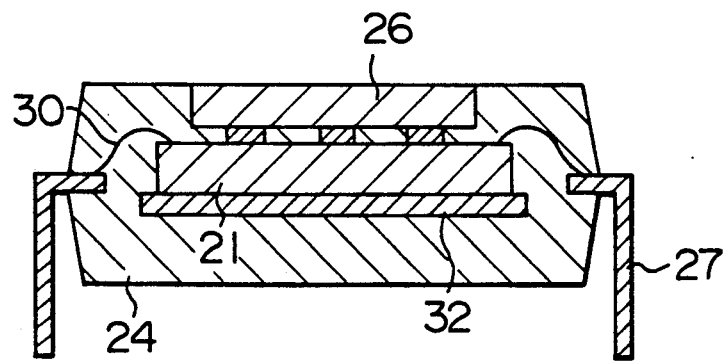
F I G. 13

F I G. 22
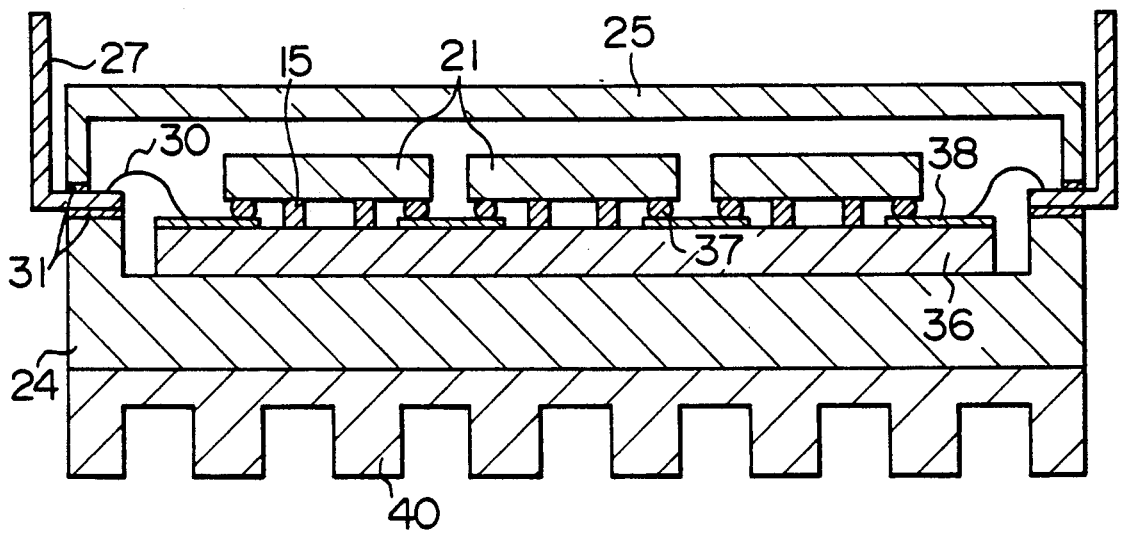
F I G. 23
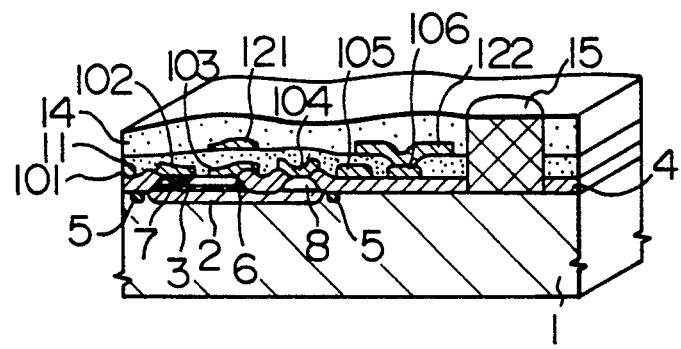
F I G. 24
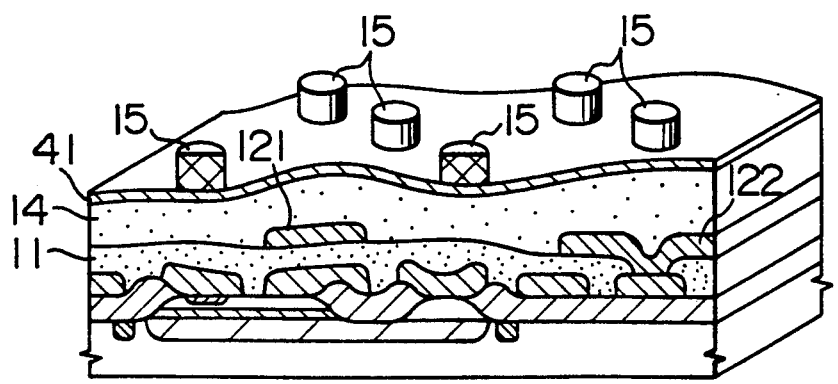

F I G. 29
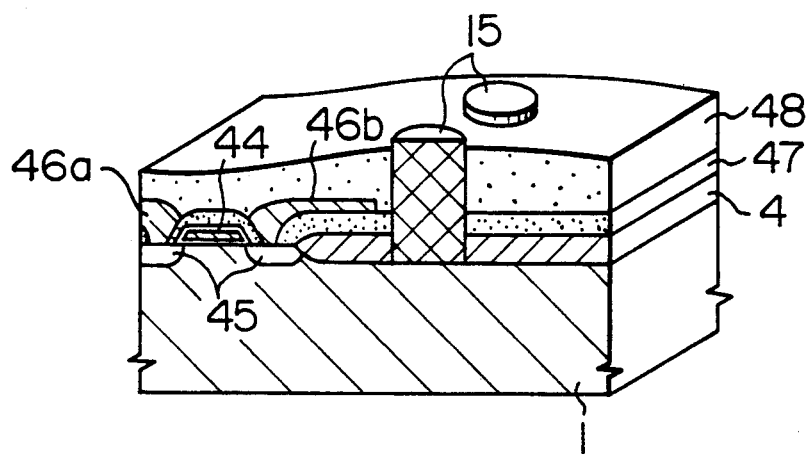
F I G. 30
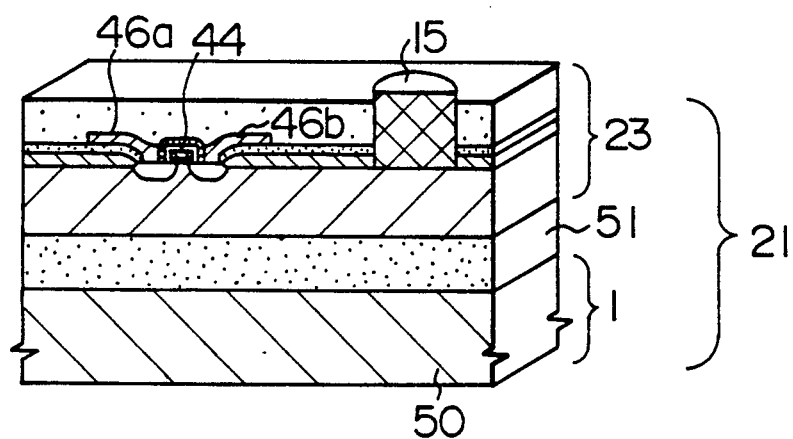
F I G. 31
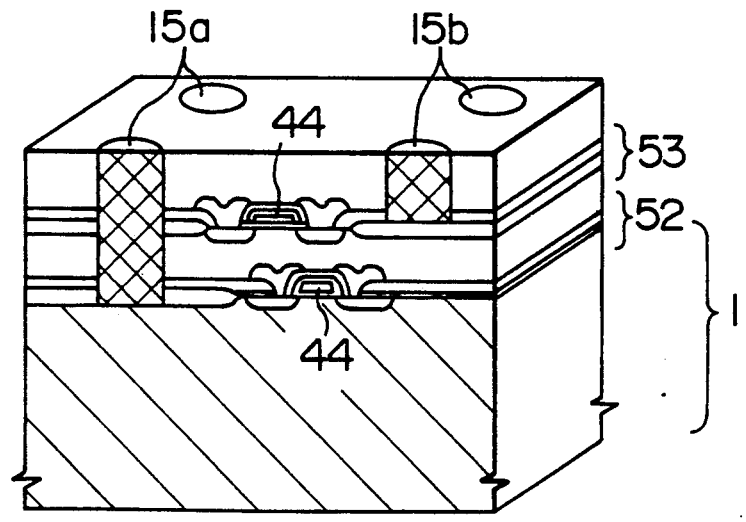

SEMICONDUCTOR APPARATUS AND SEMICONDUCTOR PACKAGE

BACKGROUND OF THE INVENTION

The present invention relates to a semiconductor apparatus and a semiconductor package and, more particularly, to a technology which is successful for a semiconductor integrated circuit apparatus having a large calorification generated therein.

A semiconductor apparatus is such that a large number of devices, such as transistors, are formed by laminating a number of thin films on a semiconductor substrate, and electrodes used for leading out electrical signals therethrough are provided in the devices.

Since these devices generate the heat during the operation of the semiconductor apparatus, the temperature rises in each of the device formation regions so that there may be caused in some cases changes in the electrical characteristics and thereby a reduction of the reliability. In the prior art, a material having a high heat conductivity is employed as the material for sealing the semiconductor apparatus for preventing such undesired problems.

The main heat source of the semiconductor apparatus is a p-n junction portion very near the surface of the semiconductor substrate. Then, most of the heat generated in the p-n junction is transferred through the semiconductor apparatus body to reach up to the surface of the semiconductor apparatus. Thereafter, it is transferred through the package body tightly bonded to the semiconductor apparatus to be released towards the outside of the apparatus. However, in the semiconductor apparatus, the temperature rise in the device portions is not sufficiently controlled as the devices of high density are integrally formed on the semiconductor substrate.

Then, in order to solve the above problem, a heat releasing function is provided in the semiconductor apparatus itself. For example, there is made an attempt to diffuse the heat in a direction parallel with the semiconductor substrate through a metallic thin plate which is formed in the semiconductor apparatus in the form of layer by the plating or the like.

Incidentally, with respect to such a prior art, there is published JP-A-48-8467.

However, when the present inventors made an attempt to form the devices more densely in the semiconductor substrate it was found that the temperature rise in each of the device portions cannot be sufficiently controlled by the above prior art.

More specifically, since in the prior art semiconductor apparatus, thick insulating films are formed over the p-n junction or the wiring, the heat radiation from the surface of the semiconductor apparatus is restrained. Therefore, most of the heat generated in the apparatus is only released from the rear surface of the semiconductor apparatus through the inside of the semiconductor substrate.

Moreover, in the case where there is an unbalance in the arrangement of the devices in the semiconductor apparatus, the prior art semiconductor apparatus has a poor heat radiating performance, and, therefore, that apparatus is partially overheated. As a result the electrical characteristics of the device are partially varied.

SUMMARY OF THE INVENTION

It is therefore an object of the present invention to provide a technology which is used with a semiconductor apparatus and is capable of making the heat generated in a p-n junction to be transferred more rapidly towards the surface of the semiconductor apparatus.

It is a further object of the present invention to provide a technology which is used with a semiconductor apparatus and is capable of radiating more rapidly the heat generated in the p-n junction towards the outside of the semiconductor apparatus.

It is an even further object of the present invention to provide a technology which is used with a semiconductor apparatus and is capable of diffusing the heat generated in the p-n junction rapidly into the semiconductor apparatus to reduce the distribution of the temperature in the semiconductor apparatus.

In order to solve the above problems, the present inventors found out that a heat transfer path (heat radiating portion) extending from a position very near the semiconductor device as a heat source to the surface of the semiconductor apparatus may be formed of a material having a large heat conductivity.

However, it was found that it is impossible to form such a heat radiating portion using the prior art, and thus according to the prior art, the heat can be only diffused mainly in a direction parallel with the semiconductor substrate.

That is, even if a heat radiating layer is formed in thin films in the form of a multilayer, because of the presence of insulating films for preventing contamination and wiring insulating films on the surface of the semiconductor apparatus and the like, the heat is readily prevented from diffusing towards the surface of the semiconductor apparatus.

Therefore, the formation of a member having a large heat conductivity through the multilayer films from the surface to the heat source is essential for overcoming the present problem. Thus, the present invention enables such a good heat conductive member to be formed.

Further, the prior art gives no consideration to the heat radiation performance effected from the surface of the semiconductor apparatus towards outside the semiconductor apparatus. On the other hand, according to the present invention, it is possible to improve the heat radiation performance for radiating the heat towards outside the semiconductor apparatus.

The semiconductor apparatus according to the present invention comprises at least a semiconductor device formed on the semiconductor substrate. The aspects thereof will hereinbelow be listed.

(1) A heat radiating body is, in addition to a current leading portion, formed to be projected from a semiconductor substrate towards the surface of the semiconductor apparatus to be exposed in the atmosphere.

(2) A semiconductor device is provided with an electrode portion and a wiring portion from at least one of which the heat radiating body is, in addition to the current leading portion, formed to be projected to the surface of the apparatus, thus being exposed in the atmosphere.

(3) The heat radiating body is formed integrally in the apparatus to be projected from a position apart from the semiconductor substrate towards the external surface of the apparatus, thus being exposed in the atmosphere.

(4) The semiconductor device is provided with the electrode portion and the wiring portion, and the heat radiating body is formed integrally in the apparatus to be projected from a position apart from at least one of the electrode portion and the wiring portion towards the external surface of the apparatus, thus being exposed in the atmosphere.

(5) The semiconductor device is provided with the electrode portion and the wiring portion and comprises a film which is formed so as to extend from at least one of the electrode portion, the wiring portion and the semiconductor substrate towards the external surface of the apparatus. That film forms neither a current flow path nor an accumulation portion of electric charge.

(6) The semiconductor device is provided with the electrode portion and the wiring portion and comprises a film which is formed locally so as to extend from at least one of the electrode portion, the wiring portion and the semiconductor substrate towards the external surface of the apparatus. That film is formed to be projected from the external surface of the apparatus without forming either the current flow path or the accumulation portion of electric charge.

(7) The semiconductor apparatus comprises a projection which is made of a material having a larger heat conductivity than that of a quartz glass, and is projected from the external surface of the apparatus without forming either the current flow path or the accumulation portion of electric charge.

(8) The semiconductor apparatus comprises a projection which is made of a material having a larger heat conductivity than that of a quartz glass and is projected from the external surface of the apparatus. A part of the projection forms the current flow path.

(9) The semiconductor apparatus comprises a projection which is made of a material having a larger heat conductivity than that of a quartz glass and is projected from the external surface of the apparatus. One end face of the projection is connected to the semiconductor substrate.

(10) The semiconductor device is provided with the electrode portion and the wiring portion and comprises the film which is formed so as to extend from at least one of the electrode portion, the wiring portion and the semiconductor substrate towards the external surface of the apparatus. A part of that film forms the current flow path.

(11) The semiconductor device is provided with the electrode portion and the wiring portion and includes therein the heat radiating portion which is formed so as to extend from at least one of the electrode portion, the wiring portion and the semiconductor substrate towards the external surface of the apparatus. The heat radiating portion forms neither the current flow path nor the accumulation portion of electric charge. Further, the heat radiating portion includes therein a heat radiating board provided thereon. In this case, it is preferable that the heat radiating board is provided over the plurality of heat radiating portions, radiating fins are provided outside the heat radiating board, or a spring is provided for pressing the heat radiating board against the heat radiating portions.

(12) The semiconductor device is provided with the electrode portion and the wiring portion and includes therein the heat radiating portion which is formed so as to extend from at least one of the electrode portion, the wiring portion and the semiconductor substrate towards the external surface of the apparatus. Radiating leads are connected to the associated heat radiating portion or portions.

(13) The semiconductor device is provided with the electrode portion and the wiring portion and includes therein the heat radiating portion which is formed so as to extend from at least one of the electrode portion, the wiring portion and the semiconductor substrate towards the external surface of the apparatus. The heat radiating portion forms neither the current flow path nor the accumulation portion of electric charge. Further, the heat radiating portions are connected to a mounting board. In this case, preferably, the heat radiating portions are connected to the mounting board through the respective solder bumps.

In each of the aspects described above, preferably, insulating layers are formed in the semiconductor substrate in the form of layer, the semiconductor device has a multilayer structure and the heat radiating body is projected from each of the layers, or the heat radiating body is disposed around a semiconductor device formation region. Moreover, each of the heat radiating portions (films) is easy to be formed by means of the selective CVD or the laser CVD.

A semiconductor package according to the present invention is formed in such a way that each of the semiconductor apparatuses of the present invention is sealed with a suitable sealing body. The sealing body may be made of either ceramics or resin. Incidentally, it is preferable that the heat radiating portion is made to be indirectly in contact with the sealing body, or the sealing body includes therein a non-contacting portion with the semiconductor apparatus. Further, it is preferable that the heat radiating portion is formed in the form of projection which is projected from the surface of the semiconductor apparatus, and a passage of fluid is defined between the projections.

According to the above aspects (1), (2) and (5), since the heat generated in the semiconductor device formation region in the semiconductor apparatus can be rapidly transferred to the surface of the semiconductor apparatus through the film (the heat radiating body which has the same meaning as the heat radiating portion, and so forth), it is possible to prevent an excessive temperature rise and to realize a stable operation of the semiconductor device.

Moreover, since the heat generated in the semiconductor device formation region can be rapidly transferred into the semiconductor apparatus, it is possible to reduce nonuniformity in temperature distribution within the semiconductor apparatus.

Accordingly, it is possible to reduce the variations in a part of the electrical characteristics of the device which are caused by the nonuniform temperature distribution within the semiconductor apparatus.

According to the above aspects (3), (4) and (6), since the film is formed so as to be projected from the surface of the apparatus, the surface area of the semiconductor apparatus can be increased, thus enabling the heat to be efficiently radiated towards the outside of the semiconductor apparatus.

Therefore, the temperature in the semiconductor device formation region can be held without rising excessively and thus it is possible to realize the stable operation of the semiconductor device.

According to the above aspect (7), since the projections are formed on the surface of the semiconductor apparatus, the surface area of the semiconductor apparatus can be increased, thus enabling the heat produced in the semiconductor apparatus to be efficiently radiated towards the outside of the semiconductor apparatus.

Therefore, it is possible to realize the stable operation of the semiconductor device.

According to the above aspect (8), in addition to the function inherent in the aspect (7), such a function is provided that a part of the wiring can be used as a heat radiating passage.

According to the above aspect (9), since the projection is formed on the surface of the semiconductor apparatus, the surface area of the semiconductor apparatus can be increased, thus enabling the heat produced in the semiconductor apparatus to be efficiently radiated towards the outside of the semiconductor apparatus.

Therefore, it is possible to realize the stable operation of the semiconductor device.

Moreover, since one of each end face of the projections is connected to the semiconductor substrate, the heat in the semiconductor apparatus can be transferred to the semiconductor substrate.

According to the above aspect (10), in addition to the function inherent in the aspect (1), such a function is provided that a part of the wiring can be used as a heat radiating passage.

According to the above aspect (11), the heat generated in the semiconductor apparatus can be transferred to the heat radiating board through the heat radiating portion. When the heat radiating board is provided over the plurality of heat radiating portions, the heat from the plurality of heat radiating portions can be transferred to the heat radiating board. When the radiating fins are provided outside the heat radiating board (i.e., on the side of the heat radiating board opposite to the side thereof confronting with the semiconductor apparatus), the heat generated in the semiconductor apparatus can be radiated in the atmosphere through the heat radiating portions, the heat radiating board and the radiating fins. When the spring for pressing the heat radiating board against the heat radiating portions is additionally provided, it is possible to relieve a thermal stress along with the temperature rise in the package.

According to the above aspects (12) and (13), the heat generated in the semiconductor apparatus can be released to the radiating leads and the mounting board through the heat radiating portions.

In accordance with the CVD technique, after a multilayer structure film for the formation of the semiconductor device is formed, the film having the heat radiating function can be formed.

When the package of the present invention is employed, the heat generated in the semiconductor apparatus can be rapidly released to the atmosphere. Moreover, when the heat radiating portions (including those having a projection shape) on the surface of the semiconductor apparatus are made to be in contact with the sealing body of the package, the heat released from the semiconductor apparatus can be efficiently transferred to the package through the projections. When the radiating leads are employed, the heat generated in the semiconductor apparatus can be rapidly transferred to the semiconductor substrate through the radiating leads.

When the heat radiating portions are connected to the mounting board, the heat generated in the semiconductor apparatus can be released to the mounting board through the heat radiating portions. Especially, when the heat radiating portions are connected to the mounting board through the respective solder bumps, the heat generated in the semiconductor apparatus can be released to the mounting board through the heat radiating portions and the solder bumps.

When each of the heat radiating portions is projected from the surface of the package to allow the fluid to flow between the projections, the heat generated in the semiconductor apparatus can be transferred from the projections on the surface of the apparatus to the fluid.

When the semiconductor device is formed in the form of a multilayer structure, since the heat is transferred rapidly through the heat radiating portions, the temperature in each of the layers become uniform. Therefore, the temperature distribution of the semiconductor device becomes uniform.

Further, when the heat radiating portions are disposed around the semiconductor device formation region, even in the case where the semiconductor devices are integrated in the semiconductor device formation region, the heat radiating portions can be formed.

As set forth hereinabove, according to the present invention, the following effects can be obtained.

(1) It is possible to improve the reliability of the operation of the semiconductor apparatus.

(2) In the semiconductor apparatus, it is possible to efficiently, rapidly release the heat generated in the semiconductor device to the outside of the semiconductor apparatus.

(3) In the semiconductor apparatus, it is possible to reduce the variations in a part of the electrical characteristics of the semiconductor device which are caused by the ununiform temperature distribution within the semiconductor apparatus.

BRIEF DESCRIPTION OF THE DRAWINGS

FIG. 6 and FIG. 7 are respectively schematic perspective views in section showing the diversity of the shape of a heat radiating portion;

FIG. 8 is a perspective view useful in explaining an example of the layout of the heat radiating portions;

FIG. 9 is a perspective view partly in cross section showing the relationship between the semiconductor apparatus of the present invention and a package for explaining the effects of the present invention;

FIG. 10 is a cross sectional view useful in explaining the flow of the heat from the semiconductor apparatus of the present invention to the package;

FIG. 11 is a schematic cross sectional view showing the package structure suitable for the semiconductor apparatus of the present invention;

FIG. 12, FIG. 13, FIG. 14, FIG. 15, FIG. 16, FIG. 17, FIG. 18, FIG. 19, FIG. 20, FIG. 21 and FIG. 22 are respectively cross sectional views showing embodiments of the package structure of the present invention;

FIG. 23 is a schematic perspective view in section showing the semiconductor apparatus of the present invention in which the heat radiating portion is formed so as to extend from the semiconductor substrate to the surface of the semiconductor apparatus;

FIG. 24 is a schematic perspective view in section showing the semiconductor apparatus of an even further embodiment of the present invention;

FIG. 28 and FIG. 29 are respectively schematic perspective views in section showing embodiments of the semiconductor apparatus in each of which the present invention is applied to a semiconductor device including therein a MOS transistor;

FIG. 30 is a schematic perspective view in section showing an embodiment in which the present invention is applied to a semiconductor substrate having the SOI structure;

FIG. 31 is a schematic perspective view in section showing an embodiment of the semiconductor apparatus in which the present invention is applied to a semiconductor device having a multilayer transistor structure;

DESCRIPTION OF THE PREFERRED EMBODIMENTS

Figure 1:
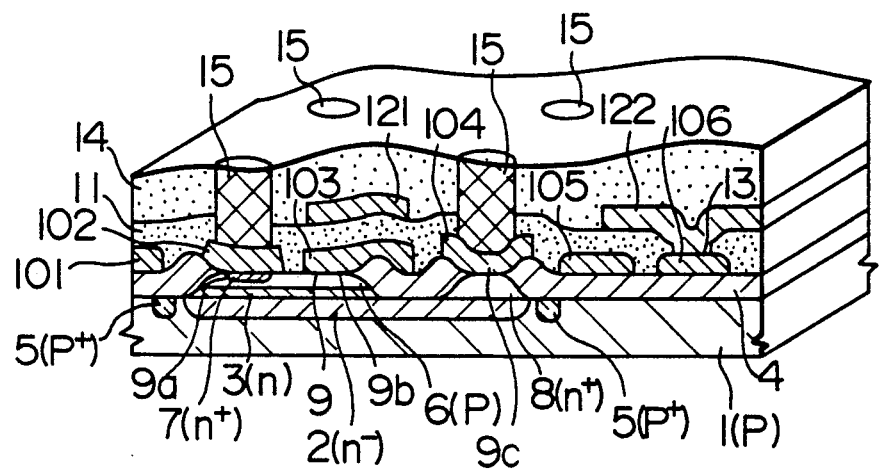
FIG. 1 is a schematic perspective view in section showing a semiconductor apparatus according to one embodiment of the present invention.

A semiconductor apparatus 21 including therein a bipolar transistor of one embodiment of the present invention is shown in FIG. 1 (the cross sectional view of the main portions).

As shown in FIG. 1, in the bipolar transistor according to the present embodiment, on a surface of a semiconductor substrate 1 such as a p type silicon substrate is provided a buried layer 2 of n+ type for exmaple. On the semiconductor substrate 1 is provided an epitaxial layer 3 of n type for example. In the predetermined portion of the epitaxial layer 3 is provided field insulating film 4 such as SiO2 film thereby to perform the isolation (i.e., the insulating separation between devices and that within a device).

Further, under the field insulating film 4, there is provided a channel stopper 5 of P+ type, for example. In the epitaxial layer 3 surrounded by the field insulating film 4, there is provided a base region 6 of p type, for example, in which there is provided an emitter region of n+ type, for example.

Incidentally, a collector region is formed by the epitaxial layer 3 under the base region 6.

Moreover, the reference numeral 8 designates a collector lead-out region of n+ type for example which is connected to the buried layer 2. Further, the reference numeral 9 designates an insulating film such as an SiO2 film which is connected to the field insulating film 4 and is formed on the surface of the epitaxial layer 3. Through the insulating film 9, opening portions 9a through 9c are bored corresponding to the emitter region 7, the base region 6 and the collector lead-out region 8, respectively.

Each of the reference numerals 101 through 106 designates a first level wiring made of a conductive film such as an aluminium film. Out of the wirings 101 through 106, the wiring 102, the wiring 103 and the wiring 104 are connected to the emitter region 7, the base region 6 and the collector lead-out region 8 through the opening portion 9a, the opening portion 9b and the opening portion 9c, respectively. On the wirings 101 through 106 is formed an insulating film 11 such as an SiO2 film, a PSG (Phospho-silicate Glass) film, or an SOG (Spin-on-Glass) film which is formed by the CVD method. On the insulating film 11 is provided each of second level wirings 121 and 122 which is made of a conductive film such as an aluminium film. Out of them, the wiring 122 is connected to the wiring 106 through the opening portion 13 bored through the insulating film 11.

Further, on the wirings 121 and 122, for the purpose of providing the insulation and preventing the contamination, there is formed an insulating film 14 such as an SiO2 film or a PSG film which is formed by the CVD method.

Moreover, heat radiating portions 15 are formed so as to extend from the wirings 101 through 106 up to the surface of the semiconductor apparatus through the insulating films 11 and 14 by means of the selective CVD method or the laser CVD method. Although the member for forming the heat radiating portion 15 may employ an insulator, a conductor or a semiconductor, preferably, it employs a material having a high heat conductivity such as Al, Cu, Si or W. Moreover, it is necessary to optimize the position of each of the heat radiating portions 15 so that the second level wirings 121 and 122 are not in contact with the heat radiating portions 15.

The description will subsequently be given with respect to one example of a manufacturing method of the bipolar type semiconductor apparatus 21 according to the present invention which is constructed as described above by referring to FIG. 2.

First, after the buried layer 2 and the channel stopper region 5 are selectively formed in the surface of the semiconductor substrate made of a single crystal, the epitaxial layer 3 is formed on the whole surface of the substrate substrate by the epitaxial growth method. Subsequently, after the predetermined portion of the epitaxial layer 3 is removed by the etching technique to form a plateau-shaped epitaxial layer, the selective thermal oxidation is performed to form the field insulating film 4. The selective film formation and the selective removal of the film by the etching can be performed using the mask formation, the following photolithography technique (the photoresist mask formation technique) and the etching technique.

Subsequently, the insulating film 9 is formed by thermally oxidizing the surface of the epitaxial layer 3 surrounded with the field insulating film 4. The field insulating film 4 and the insulating film 9 can be thermally oxidized by being held in the high temperature oxidizing ambiance of about 900° to 1000° C.

By implanting ions of n type impurity such as phosphorus ions into the epitaxial layer 3, the collector leading region is formed. Further, by implanting ions of p type impurity such as boron ions into the epitaxial layer 3, the base region 8 is formed.

Next, after the predetermined portion of the insulating film 9 is removed by the etching to form the opening portion 9a, the emitter region 7 is formed by selectively implanting ions of n type impurity such as arsenic ions through the opening portion 9a. Then, after the opening portions 9b and 9c are formed through the insulating film 9, a conductive film such as an aluminium film is deposited by the sputtering method, the CVD method or the like. Then, the aluminium film is patterned into the predetermined shape to form the first level wirings 101 through 106.

Thereafter, the application type insulating film 11 such as an SOG film is applied to the whole surface, and the baking is then performed.

Incidentally, the SOG film is formed in such a way that a liquid material which is obtained by dissolving $Si(OH)_4$ in alcohol is applied to the surface of the substrate body to be subjected to the baking. Moreover, a PSG film or an $SiO_2$ film formed by the CVD method may be used as the insulating film 11. After the predetermined portion of the insulating film 11 is removed by the etching technique to form the opening portion 13, a conductive film such as an aluminium film is deposited by the sputtering method, the CVD method or the like for example. Then, the alumimium film is patterned to form the second level wirings 121 and 122. Further, the insulating film 14 such as an SOG film is formed over the whole surface.

Figure 2:
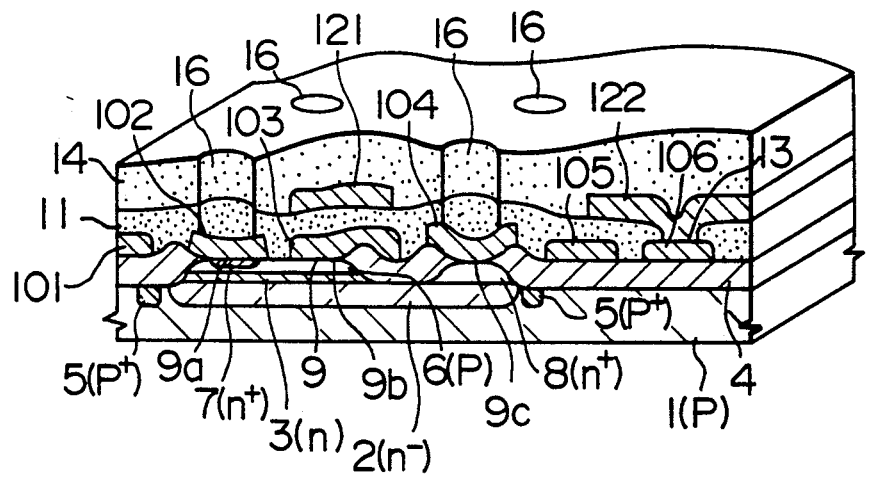
FIG. 2 is a schematic perspective view in section showing a manufacturing process of the semiconductor apparatus according to one embodiment of the present invention shown in FIG. 1.

Next, as shown in FIG. 2, the predetermined portions are selectively etched away using the mask formation, the following photolithography technique (the photoresist mask formation technique) and the etching technique, to partially expose the first level wirings 101 through 106 thereby to form heat radiating portion forming holes 16.

Further, by using the selective CVD method, the heat radiating portion 15 can be formed in only each of the heat radiating portion forming holes 16 through which the first level wirings 101 through 106 are exposed through the etching process.

The selective CVD method is such that in the case of tungsten for example, the halide such as tungsten hexafluoride ($WR_6$) is used as a raw material and the reduction is then caused under the conditions of a low temperature of 523 to 773 K or so and a low pressure of less than 1 Torr thereby to deposit the tungsten film.

As the reducing agent, for example, hydrogen ($H_2$), silane ($SiH_4$), disilane ($Si_2H_6$), or trisilane ($Si_3H_8$) is used. In this case, the film is deposited on only the surface of the special material. In the case of the tungsten film, it is certified that the tungsten film is selectively deposited on a member made of molybdenum, tungsten, platinum, germanium, aluminium, or gallium arsenide while it is difficult for that film to deposit on various oxides or a silicon nitride film. Therefore, if each of the first level wirings 101 through 106 is made of one of the above materials, it is possible to readily form each of the heat radiating portions 15.

Moreover, the selective growth can be performed with respect to a film made of aluminium or copper as well, and therefore, the material of the heat radiating portion 15 may employ one of tungsten, aluminium and copper.

In the present embodiment, while the heat radiating portions 15 are formed so as to extend from the first level wirings 101 through 106, alternatively, they may be formed so as to extend from the second level wirings 121 and 122 up to the surface of the semiconductor apparatus.

Moreover, the heat radiating portions 15 may be formed using the laser CVD method.

After the insulating film 14 is formed on the second level wirings 121 and 122, the predetermined portions thereof to form the respective heat radiating portions 15 are selectively etched away using the mask formation, the following photolithography technique (the photoresist mask formation technique) and the etching technique to expose the wirings 101 through 106 to form the heat radiating portion forming holes 16. Then, the laser beam is applied to the resultant heat radiating portion forming holes 16 in the raw gas ambience.

Then, the gaseous molecules in the raw gas are decomposed by the energy of the laser beam so that the free atoms (molecules) can be deposited in the laser irradiated areas, i.e., the heat radiating portion formating holes 16. Thus, the heat radiating portions 15 can be formed.

For example, in the case where molybdenum is intended to be deposited in the heat radiating portion forming holes 16, the heat radiating portion forming holes 16 may be irradiated with the laser beam from the Ar gas laser for example in the presence of $Mo(CO_6)$ gases.

Figure 3:
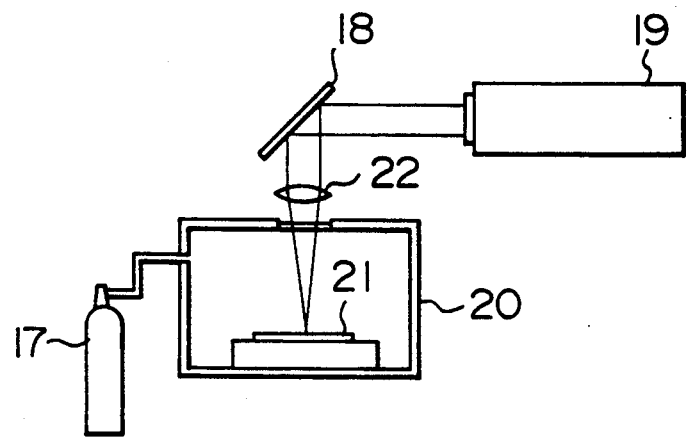
FIG. 3 and FIG. 4 are respectively views useful in explaining the schematic arrangements of a laser CVD system used in the embodiment of the present invention.
Figure 4:
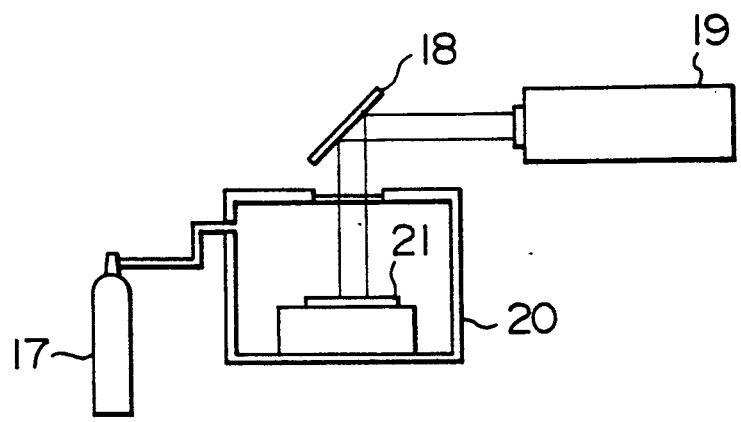

FIG. 3 is a schematic view showing the film deposition system using the present laser CVD processing. In the case where the heat radiating portions with a small size are formed, the arrangement shown in FIG. 3 is desirable in which the laser beam is passed through the objective lens 22 to be condensed i.e. narrowed. However, the system having the arrangement shown in FIG. 4 may be available.

The present laser CVD system is made up of a gas bomb 17 filled with the raw gases, a mirror 18, a laser oscillator 19, a chamber 20 and a semiconductor apparatus 21 as a sample. In such an arrangement, the laser beam emitted from the laser oscillator 19 is reflected by the mirror 18 to be applied to the objective lens 22 to be condensed. Then, it is introduced into the chamber 20 to be applied to the semiconductor apparatus 21.

Moreover, the raw gases are introduced from the gas bomb 17 into the chamber 20. As the material of which each of the heat radiating portions 15 can be made using the laser CVD method in such a way, there are available copper, gold, zinc, cadmium, aluminium, gallium, indium, titanium, chromium, molybdenum, tungsten, iron, nickel, platinum, carbon, silicon, germanium, tin, gallium arsenide, indium phosphide, titanium carbide, silicon nitride, alumina, silicon oxide, and titanium oxide. However, taking the function of each of the heat radiating portions 15 into consideration, a material having a larger heat conductivity, e.g., a metal such as copper, gold, aluminium or the like, or semiconductor is most suitable for the heat radiating portion.

In the following table, there are shown the raw gases and the kinds of the laser beam necessary for the case where each of the heat radiating portions is made of the above material using the laser CVD method.

| The objects of Deposit | The Raw Gases | The irradiating Laser Beams | | | | | | | | |
|---|---|---|---|---|---|---|---|---|---|---|
| | | Ar | Kr | $CO_2$ | ArF | KrF | ArSHG | CuSHG | XeCr | YAG |
| Cu | Biss-hexafluoropentanedionate | ○ | ○ | ○ | | | | | | |
| Au | $Au(CH_3)_2(CH_3COCHCOCH)$ | ○ | | | | | | | | |

-continued

| The objects of Deposit | The Raw Gases | Ar | Kr | CO$_2$ | ArF | KrF | ArSHG | CuSHG | XeCr | YAG |
|---|---|---|---|---|---|---|---|---|---|---|
| Al | Al(CH$_3$)$_3$ | ○ | | | ○ | ○ | ○ | | | |
| Ga | Ga(CH$_3$)$_3$ | | | | | | ○ | | | |
| In | InI, In(CH$_3$)$_3$ | | | | ○ | ○ | | | | |
| Ti | TiI | | | | ○ | ○ | ○ | | | |
| Cr | Cr(CO)$_6$ | | | | ○ | ○ | | ○ | | |
| Mo | Mo(CO)$_6$ | | | | ○ | ○ | | ○ | | |
| W | W(CO)$_6$·WF$_6$ | | | | ○ | ○ | | ○ | | |
| Ni | Ni(CO)$_4$ | ○ | ○ | | | | | | | |
| Si | SiH$_4$, Si$_2$H$_6$, SiCl$_4$ | | ○ | | ○ | ○ | ○ | | ○ | |
| Ge | GeH$_4$, Ge(CH$_3$)$_4$ | | ○ | | ○ | ○ | ○ | | ○ | |
| GaAs | Ga(CH$_3$)$_3$ + AsH$_3$ | | ○ | | | | | | | ○ |
| InP | In(CH$_3$)$_3$ + PH$_3$ | | | | ○ | ○ | | | | |

Moreover, in the process of exposing the wirings 101 through 106 to form the heat radiating portion forming holes 16 after forming the insulating film 14, such holes may be bored using the laser beam instead of the etching technique.

Figure 5:
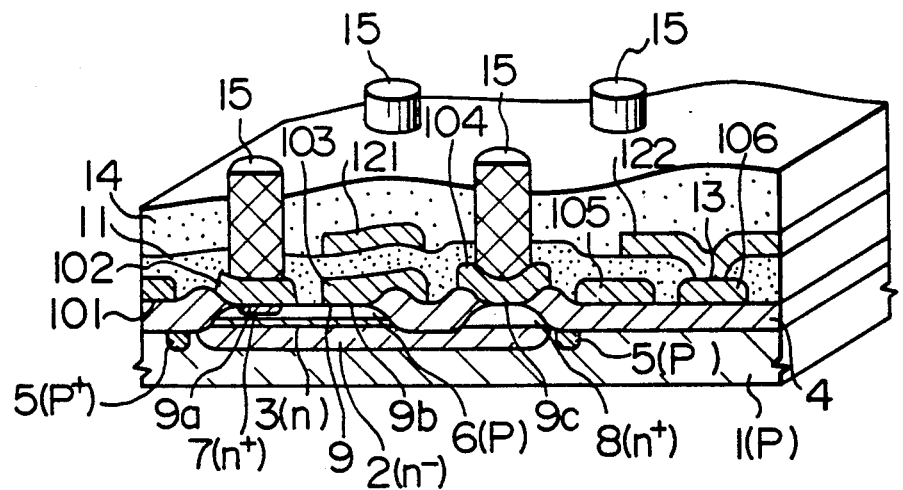
FIG. 5 is a schematic perspective view in section showing a semiconductor apparatus according to a further embodiment of the present invention.

FIG. 5 is a schematic perspective view in section showing a semiconductor apparatus according to a second embodiment of the present invention. As compared with the above first embodiment, the present embodiment is characterized in that the heat radiating portion 15 has a projection structure, i.e., includes cylindrically shaped projections extended to protrude outwardly from the semiconductor apparatus surface, so that the heat is readily released from the heat radiating portion 15 to the outside of the semiconductor apparatus.

The description will hereinbelow be given with respect to one example of a manufacturing method in the present embodiment by taking a bipolar transistor by way of example. In the present embodiment, the insulating film 14 is deposited thickly as compared with that of the above first embodiment. Therefore, each of the heat radiating portions 15 which are selectively formed is also correspondingly formed in a long shape. Subsequently, by etching only the insulating film by the predetermined quantity, the structure shown in FIG. 5 is realized.

Figure 6:
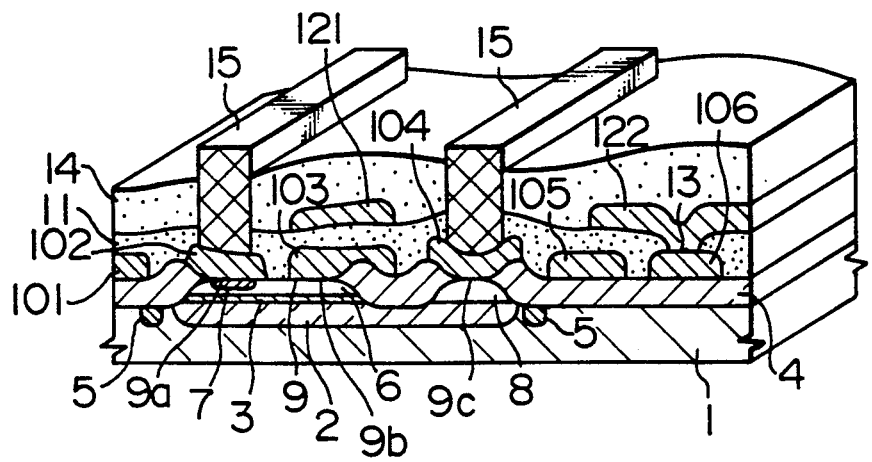

The shape of the heat radiating portion 15 must be optimized corresponding to the arrangement of the semiconductor devices and the shape of the package. For example, in addition to the shape shown in FIG. 5, a longitudinal shape as shown in FIG. 6 may be used for the heat radiating portion.

Figure 33:
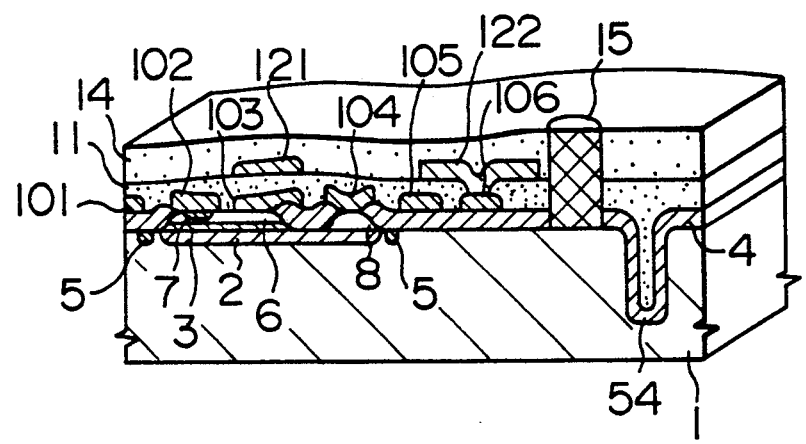
Figure 34:
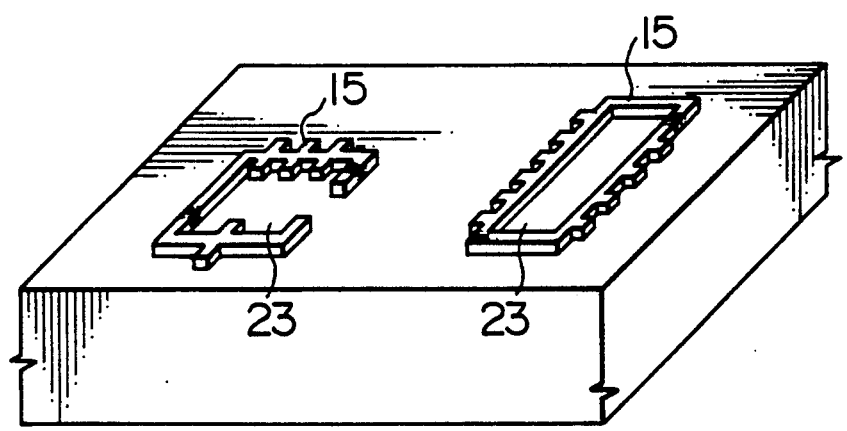
FIG. 34 is a perspective view useful in explaining an example of the layout of the heat radiating portion.

When the laser CVD technique is used, the shape of the heat radiating portion 15 as shown in FIG. 7 may be also realized by changing the spot diameter of the laser beam in two steps. Moreover, in the case where the device formation regions 23 are formed in an insular arrangement in the semiconductor apparatus as shown in FIG. 8, the heat radiating portion 15 may be also formed so as to surround the device formation regions. For example, a heat radiating cylinder may be also formed so as to surround the periphery of the field insulating films 4 of each of the transistors within the device formation region 23. Moreover, it may be also formed so as to surround each of the memory cells within the device formation region 23. Further, in the case where for the purpose of providing the same function as that of the field insulating film 4, after a trench 54 is formed, it is filled with an insulating film to form the isolation structure, as shown in FIG. 33, the heat radiating portion may be also formed inside the insulating film filling in the trench 54 of each of the transistors within the device formation region 23. Further, as shown in FIG. 34, the heat radiating cylinder surrounding the associated device may be also formed in a configuration with heat radiating fins. As a result, it is possible to release efficiently the heat to the outside of the semiconductor apparatus.

The effects of the above-mentioned embodiments according to the present invention will hereinafter be described with reference to FIG. 9, FIG. 10 and FIG. 11.

FIG. 9 is a perspective view partly in cross section showing one example of the relationship between the semiconductor apparatus 21 and a package. The semiconductor apparatus 21 is mounted on a base 24 and is tightly sealed by bonding a cap 25 and a heat radiating board 26 to each other to be covered therewith. Moreover, leads 27 for transferring therethrough the electrical signals from the semiconductor apparatus 21 to the outside are bonded to the both sides of the base 24.

FIG. 10 is a cross sectional view showing the package structure shown in FIG. 7. The flow of the heat from the semiconductor apparatus 21 will be explained on referring to FIG. 10.

In the prior art, since the surface of the semiconductor apparatus 21 is covered with a thick insulator having a small heat conductivity, the heat generated in the device formation region 23 is mainly transferred to the rear surface of the semiconductor apparatus 21 through the inside of the semiconductor apparatus and is then released to the outside of the package through the base 24 and the leads 27.

However, according to the present invention, a large number of heat radiating portions 15 each having a larger heat conductivity than that of an insulator are provided so as to extend from the vicinity of the heat sources to the surface of the semiconductor apparatus 21. Therefore, it is possible to rapidly transfer the heat generated in the device formation region to the surface of the semiconductor apparatus 21 through the wirings 101 through 106 and the heat radiating portions 15.

For example, the heat conductivity of a transparent quartz glass, which is the main constituent material of the surface of the semiconductor apparatus in the prior art, is about 0.003 cal/cm·s·°C., whereas that of copper forming the constituent material of the surface of the semiconductor apparatus of one embodiment of the present invention is about 0.94 cal/cm·s·°C. As is apparent from this, the heat transfer in the copper is about 300 times as rapid as that in the prior art material.

More specifically, the effects inherent in the present invention with respect to the structures shown in FIG. 1 and FIG. 3 are as follows. It is assumed that the diameter of each of the heat radiating portions 15 is 3 μm, the material thereof is tungsten, heat conductive grease is filled between a heat transfer board 28 made of aluminium (not shown) and each heat radiating portion 15, and the size of the heat generating portion is $1 \times 3$ μm. Then, as compared with the case where the heat is radiated only from the rear surface 50 of the semiconductor substrate, the quantity of heat radiation is increased by about 20%, because of the addition of heat radiation from the heat radiating portions 15. As a result, there is provided the effect in that the maximum temperature in the device is decreased so that the reliability of the semiconductor apparatus 21 is enhanced by about 10%.

Accordingly, according to the present invention, since a large number of heat radiating paths are formed as indicated by arrows in FIG. 10, the temperature of the device formation region 23 can be kept at a low level, and this allows the stable operation of the transistor to be performed.

Moreover according to the present invention, by arranging a large number of heat radiating portions 15, the speed of the heat transfer in the semiconductor apparatus 21 becomes higher. Therefore, even in the case of presence of the deviation of the arrangement of the devices in the semiconductor apparatus 21, it is possible to relieve the nonuniform distribution of temperature.

Moreover, according to the second embodiment of the present invention shown in FIG. 5, FIG. 6 and FIG. 7, there are provided the functions in that the heat generated in the transistor is transferred rapidly to the surface of the semiconductor apparatus 21, and also the surface of the semiconductor apparatus 21, i.e., the surface area of the heat radiating portions is increased. Therefore, there is provided the effect in that the radiation of the heat from the surface of the semiconductor apparatus 21 is also accelerated. Accordingly, in accordance with the present embodiment, the temperature of the whole semiconductor apparatus 21 is prevented from rising excessively, and it can be ensured that the semiconductor apparatus is stably operated for a long period of time.

Since one object of the present invention is to more rapidly transfer the heat generated inside the semiconductor apparatus 21 to the surface of the semiconductor apparatus 21, the semiconductor apparatus is inseparable from the method of rapidly radiating the heat of the surface of the semiconductor apparatus 21 transferred thereto according to the present invention to the outside through the package.

Then, an embodiment in which the package structure is optimized (corresponding to the semiconductor apparatus according to the present invention) is shown in FIG. 11. According to the present embodiment, including therein the optimum package structure, since each of the heat radiating portions 15 and the heat transfer board 28 are made to be in contact with each other, the heat generated in the device formation region can be transferred to the heat radiating board 26 through the heat radiating portions 15 and the heat transfer board 28.

Moreover, by forcing the fluid to flow through a hole 29 defined between the semiconductor apparatus 21 and the heat transfer board 28 or the heat radiating board 26, in the same manner as in the above case, the heat from the heat radiating portions 15 can be also released.

Further, the description will be given with respect to one embodiment of the semiconductor package according to the present invention, on referring to FIG. 12.

FIG. 12 is a cross sectional view showing one embodiment of a semiconductor package according to the present invention.

In FIG. 12, the semiconductor apparatus 21 is mounted to a recess portion in the base 24 and is tightly sealed by bonding the base 24 and the cap 25 to each other. The leads 27 which are electrically connected to the semiconductor apparatus 21 through respective metallic fine wirings 30 are disposed around the semiconductor apparatus 21. Each of the leads 27 is extracted from the associated position between the base 24 and the cap 25 to the outside of the package.

The bonding between the base 24 and the cap 25 and the fixing of the leads 27 are performed using a low melting point glass.

On the surface of the semiconductor apparatus 21 are formed the heat radiating portions 15 for radiating the heat generated in the semiconductor apparatus and on the heat radiating portions 15 is disposed the heat transfer board 28 which is in contact with the cap 25. Each of the heat radiating portions 15 is made of a material having a larger heat conductivity than that of the insulator covering the surface of the semiconductor apparatus 21 except the bonding portions of the metallic fine wirings 30.

According to the present embodiment, it is possible to radiate the heat generated in the semiconductor apparatus 21 from the cap 25 to the outside of the package through the heat radiating portions 15 and the heat transfer board 28. As a result, it is possible to reduce the temperature of the semiconductor apparatus 21 to a low level, and this allows the semiconductor device to be stably operated.

Incidentally, the heat transfer board 28 and the cap 25 may be simply in contact with each other, or may be bonded to each other using a suitable adhesive agent of good heat conductivity.

FIG. 13 is a cross sectional view showing another example of the semiconductor package of the embodiment shown in FIG. 12. In FIG. 13, the heat radiating board 26 is arranged on the heat radiating portions 15 which are formed on the surface of the semiconductor apparatus supported by a tab 32. The side of the heat radiating board 26 opposite to the side thereof confronting with the semiconductor apparatus is exposed from the package surface.

The plurality of leads 27 are disposed around the semiconductor apparatus 21 and are electrically connected to the electrodes on the surface of the semiconductor apparatus through the respective metallic fine wirings 30. In the present embodiment, the semiconductor apparatus 21, the heat radiating board 26, the leads 27, the tab 32 and the metallic fine wirings 30 are sealed with the suitable resin to form the semiconductor package.

Figure 14:
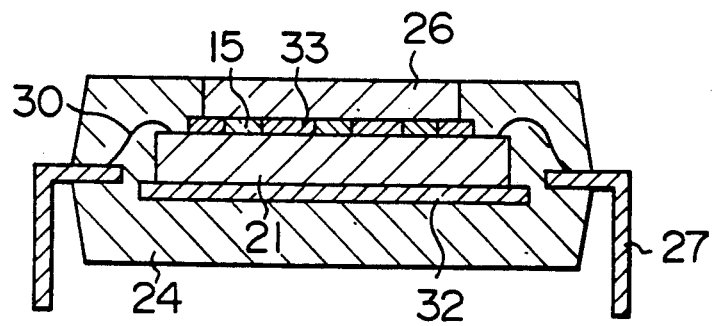

FIG. 14 is a cross sectional view showing a further embodiment of the present invention. The present embodiment is different from the example shown in FIG. 13 in the arrangement between the semiconductor apparatus 21 and the heat radiating board 26. That is, in the present embodiment, in addition to the heat radiating portions 15, the insulating portion 33 is provided therebetween.

Figure 15:
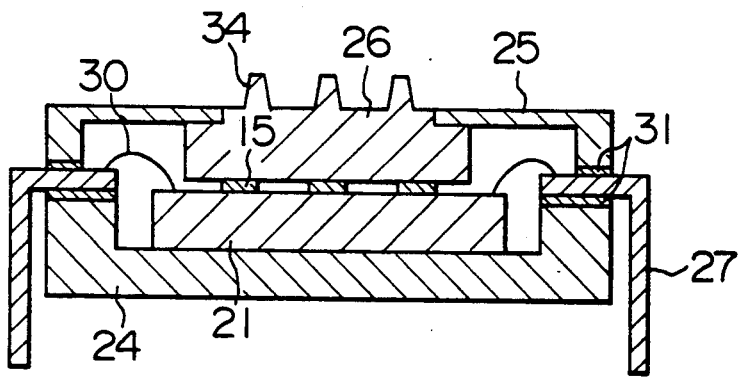

FIG. 15 is a cross sectional view showing a still further embodiment of the semiconductor package of the present invention.

In FIG. 15, on the heat radiating portions 15 on the surface of the semiconductor apparatus is provided the heat radiating board 26 with fins. The semiconductor apparatus 21, the heat radiating board 26 with fins, the leads 27 and the metallic fine wirings 30 are sealed by bonding the base 24 and the cap 25 to each other.

Fin portions 34 of the heat radiating board 26 with fins are projected outwardly from the package.

As in the present embodiment, the heat radiating board 26 provided with the fins is disposed on the heat radiating portions. This allows the heat radiation efficiency to be further improved.

Figure 16:
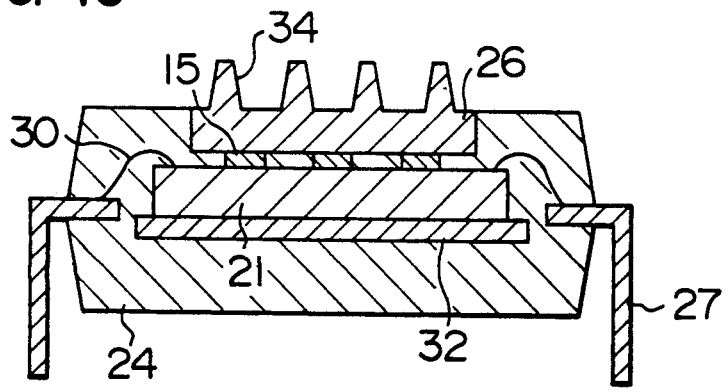

Moreover, as shown in FIG. 16, the semiconductor apparatus 21, the heat radiating board 26 with fins, the tab 32, the leads 27 and the metallic fine wirings 30 may be sealed with the suitable resin to form the semiconductor package.

In this case as well, the fin portions 34 of the heat radiating board 26 with fins are formed to be projected outwardly from the package so as to be independent of one another.

Although FIG. 15 and FIG. 16 show the examples in which the heat radiating board 26 and the fins are formed integrally with each other, the heat radiating board 26 and the fins may be separated from each other. According to the present invention, the heat generated in the semiconductor apparatus is radiated from the radiating fins to the outside of the semiconductor package through the heat radiating board 26 and the base 24.

As a result, the temperature of the semiconductor apparatus can be held at a low level, and this allows the semiconductor apparatus to be stably operated.

Figure 17:
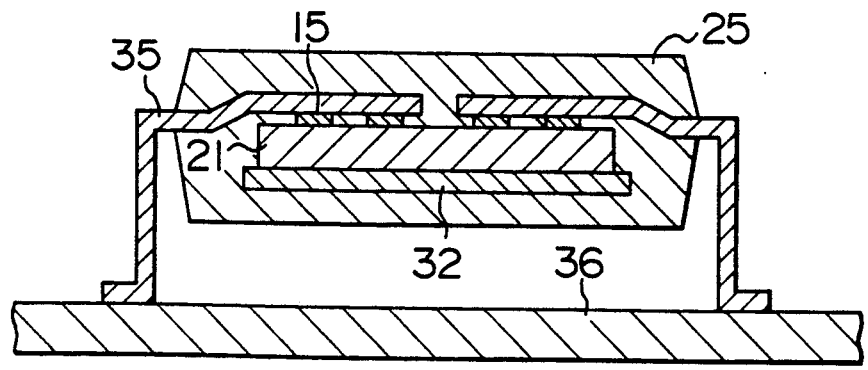

FIG. 17 is a cross sectional view showing a yet further embodiment of the semiconductor package of the present invention. In the figure, the semiconductor apparatus is supported by the tab 32 and the leads 27 (not shown) are electrically connected to the semiconductor apparatus.

On the heat radiating portions on the surface of the semiconductor apparatus are formed heat radiating leads 35 which are extracted from the sides of the package to the outside and tips of which are bonded to the mounting board 36.

In the present embodiment, the semiconductor apparatus 21, the tab 32, the leads 27, and the heat radiating leads 35 are sealed with the suitable resin to form the semiconductor package. According to the present embodiment, the heat generated in the semiconductor apparatus 21 can be released from the mounting board 36 through the heat radiating portions 15 and the heat radiating leads 35.

Figure 18:
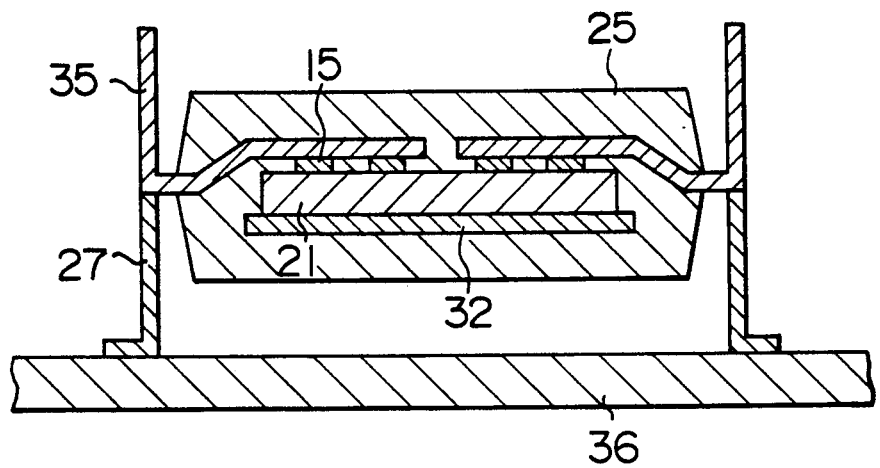

Although there is shown in FIG. 17 an example in which the tips of the heat radiating leads 35 are bonded to the mounting board 36 to perform the heat radiation from the mounting board 36, such an arrangement may be available that, as shown in FIG. 18, the heat radiating leads 35 are not bonded to the mounting board 36 but bonded to the heat radiating board itself. In this case, the heat is released from the surfaces of the heat radiating leads 35 to the outside of the package.

Figure 19:
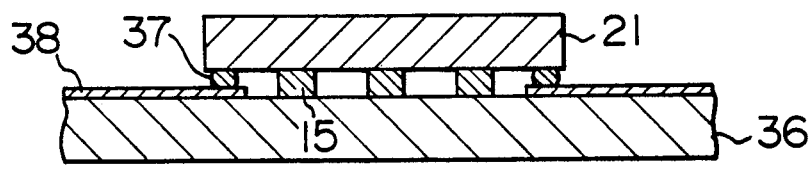

FIG. 19 is a cross sectional view showing an even further embodiment of the semiconductor apparatus of the present invention. In the figure, the semiconductor apparatus 21 is electrically connected to the wiring portions 38 on the mounting board through bumps 37. As apparent from the cross sectional view of the mounting board 36 of the semiconductor apparatus 21, the heat radiating portions 15 are formed so as to be connected to the nonwiring portions of the mounting board 36.

According to the present embodiment, the heat generated in the semiconductor apparatus can be released from the mounting board to the outside of the semiconductor apparatus 21 via the heat radiating portions 15.

Figure 20:
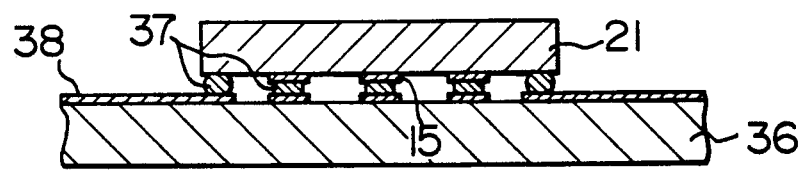

Although there is shown in FIG. 19 an example in which the heat radiating portions 15 on the surface of the semiconductor apparatus and the mounting board 36 are directly connected to one another, such an arrangement may be available that, as shown in FIG. 20, the heat radiating portions 15 are connected to the mounting board 36 through the bumps 37.

Figure 21:
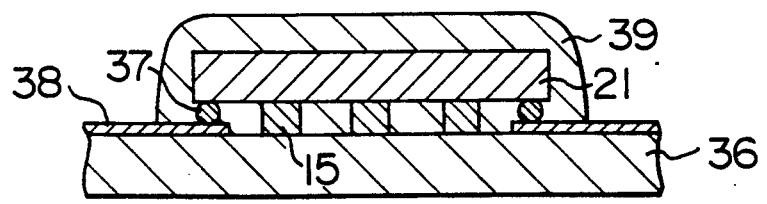

The heat radiation effect of the embodiments shown in FIG. 19 and FIG. 20 is further enhanced in the case where the semiconductor apparatus is sealed with resin 39 as shown in FIG. 21.

FIG. 22 is a cross sectional view showing an example of the semiconductor package of the present invention. The semiconductor apparatus 21 which is provided with the electrodes 38 for being connected to the base 24 through the bumps 37 and the heat radiating portions 15 on the surface thereof is disposed on the base 24. The electrodes 38 of the semiconductor apparatus 21 and the heat radiating portions 15 of the substrate are electrically connected to one another.

The leads 27 are disposed around the mounting board 36, and one ends of the leads 27 are connected to the base 24. The semiconductor apparatus 21, the board 36, the metallic film wirings 30 and parts of the leads 27 are sealed by bonding the base 24 and the cap 25 to each other. The other ends of the leads 27 are extracted to the outside of the package through the bonding portion between the base 24 and the cap 25. The bonding between the base 24 and the cap 25 and the fixing of the leads 27 are performed using the low temperature melting point glass 31 or the like. On the side of the base 24 opposite to the side thereof confronting with the board are provided a plurality of radiating fins 40.

FIG. 23 is a schematic perspective view in section showing an embodiment of the present invention. In the present embodiment, after the heat radiating portion forming holes 16 (occuring during the manufacture of the embodiment shown in FIG. 23) are formed so as to extend from the surface of the semiconductor substrate 1 or the epitaxial layer 3 to the surface of the semiconductor device by the etching technique, the heat radiating portions 15 each being made of tungsten are formed in such portions as not to intersect the first level wirings 101 through 106 and the second level wirings 121 and 122, by the tungsten selective CVD method.

Moreover, it is also possible to form the heat radiating portions 15 using the laser CVD method as shown in the first embodiment. According to the present embodiment, each of the heat radiating portions 15 is formed so as to extend from the semiconductor substrate 1 or the epitaxial layer 3 towards the surface of the semiconductor apparatus 21.

Thus, since the heat in the transistor can be directly transferred from the heat radiating portions 15 to the surface of the semiconductor apparatus 21 without going through the wirings 101 through 106, it is possible to radiate the heat more efficiently.

Moreover, as shown in the second embodiment of the present invention, by arranging each of the heat radiating portions 15 in such a way as to be projected outwardly from the surface of the semiconductor apparatus 21, the heat radiation to the outside of the semiconductor apparatus can be more efficiently performed.

FIG. 24 is a schematic cross sectional view showing a fourth embodiment of the present invention. In the same manner as in the first embodiment, after the patterning is performed to form the second level wirings 121 and 122, the insulating film is formed over the whole surface.

Thereafter, a metal film 41 made of tungsten for example is formed on the insulating film 14 by the sputtering method for example, and a guide film 42 such as an SOG film (Spin-on-Glass film) is then formed over the whole surface of the metal film 41.

Further, the predetermined portions of the guide film 42 are selectively etched away to partially expose the metal film 41. Thus, the heat radiating portion forming holes 16 are formed which is not shown in FIG. 24 since the process of manufacturing the embodiment of FIG. 24 is not completed.

Figure 25:
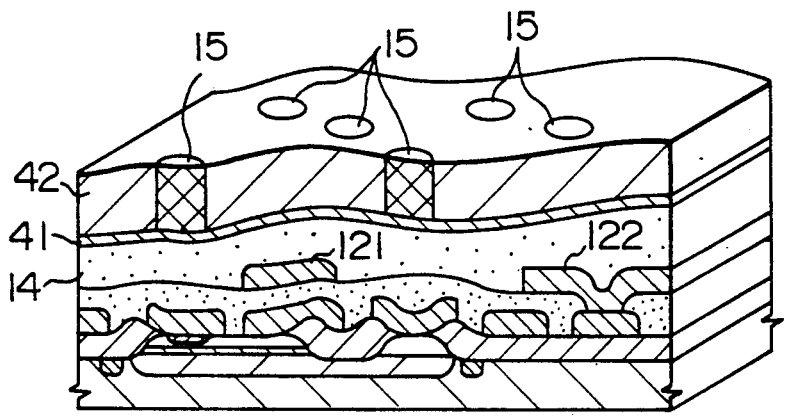
FIG. 25 is a schematic perspective view in section showing a manufacturing process of the semiconductor apparatus according to the embodiment shown in FIG. 24.

Subsequently, a tungsten film for example is disposed in each of the heat radiating portion forming holes 16 by the selective CVD method to form each of the heat radiating portions 15 as shown in FIG. 25. In this case, the guide film 42 must be such an insulating film or the like as to be free from the film deposition by the selective CVD method.

After forming the heat radiating portions 15, only the guide film 42 is selectively removed by the etching technique to obtain the structure shown in FIG. 24. By using the laser CVD method, the heat radiating portions 15 may be also formed in a similar manner. In this case, the guide film 42 may not be an insulating film and besides the metal film 41 may not be formed.

According to the present embodiment, since by providing the heat radiating portions 15, the surface area of the semiconductor apparatus 21 is increased, the heat can be radiated to the outside of the semiconductor apparatus 21 more rapidly.

Moreover, in the case of presence of deviation of the arrangement of the transistors in the semiconductor apparatus 21, the temperature distribution in the semiconductor apparatus 21 becomes nonuniform. However, the provision of the metal film 41 having a large heat conductivity over the whole surface allows the temperature distribution to be more uniform.

Figure 26:
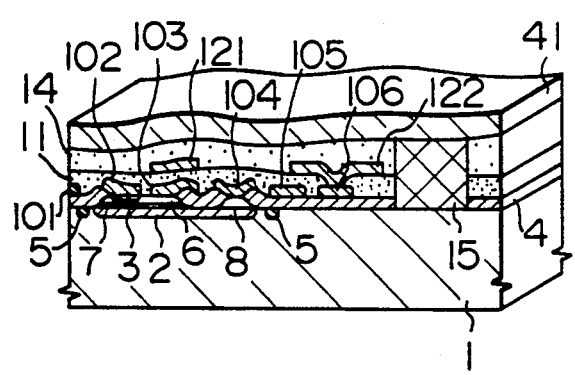
FIG. 26 and FIG. 27 are respectively schematic perspective views in section showing still further embodiments of the present invention.

As shown in FIG. 26, such an arrangement may be available that the surface of the semiconductor apparatus is covered with the metal film 41 and one ends of the heat radiating portions 15 are connected to the metal film 41.

Figure 27:
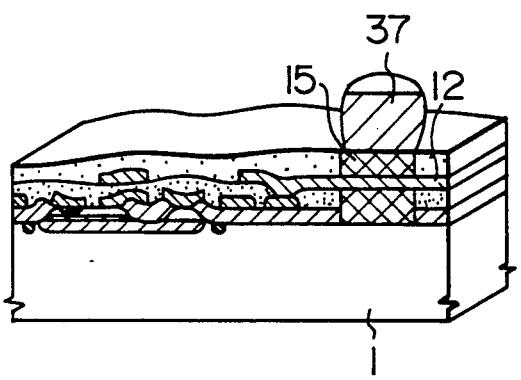

FIG. 27 is a schematic perspective view in section showing still another embodiment of the present invention. The first level heat radiating portions 15 are formed so as to extend from the semiconductor substrate 1 to the wiring 12 and further the second level heat radiating portions 15 are formed so as to extend from the second level wirings 121 and 122 to the respective bumps 37. According to the present embodiment, since the heat generated in the transistor can be transferred to the mounting board 36 (not shown in FIG. 27) via the first level heat radiating portions 15, the wirings 121 and 122, the second level heat radiating portions 15 and the bumps 37, the calorification in the transistor can be efficiently, rapidly radiated.

Figure 28:
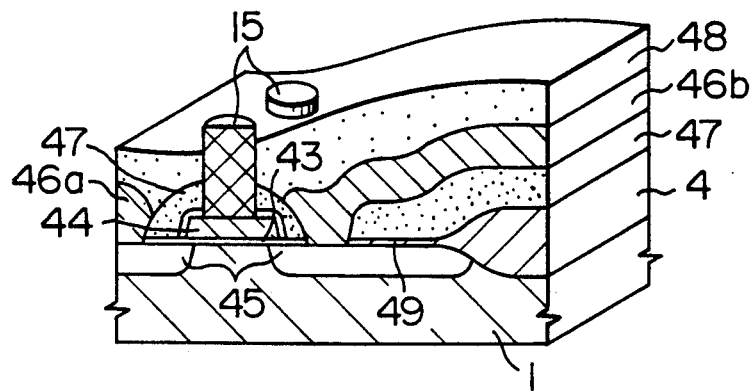

FIG. 28 is a schematic perspective view in section showing a semiconductor device, as a fifth embodiment of the present invention, in which the present invention is applied to a MOS transistor. As shown in FIG. 28, in the MOS transistor of the present embodiment, on the surface of a single crystalline semiconductor substrate 1, such as a p type silicon substrate, is provided a gate insulating film 43, such as an $SiO_2$ film, on the predetermined portion of which a gate electrode 44 made of a conductive film, such as a polycrystalline silicon film (polysilicon film), is formed.

Moreover, in the semiconductor substrate on the both sides of the gate electrode 44 are formed diffusion layers 45 of n type, for example which correspond to a source region and a drain region of the MOS transistor, respectively. To the diffusion layers 45 are connected wirings 46a and 46b each being made of an aluminium film for example, respectively. For preventing the accidental shorts among the wirings 46a and 46b, the gate electrode 44 and the semiconductor substrate 1, between these films adjacent to each other is provided an interlayer insulating film 47 made of a PSG film for example.

Moreover, for the purpose of electrically separating the semiconductor device of interest from the adjacent semiconductor devices, there is provided a field insulating film 4 made of an $SiO_2$ film, for example. Further, for the purpose of preventing the semiconductor device from being contaminated, there is provided an insulating film 48 made of a PSG film for example. The heat radiating portions 15 each of which is made of a material having a large heat conductivity such as aluminium, or tungsten are formed so as to extend from the respective gate electrodes 44 up to the surface of the semiconductor apparatus 21 through the interlayer insulating film 47 and the insulating layer 48.

The description will subsequently be given with respect to the outline of one example of the manufacturing method of the MOS transistor according to the present embodiment.

First, the p type single crystalline silicon which has a resistivity of about 10 $\Omega$cm and in which (100) orientation can be used as the device formation face is prepared as the semiconductor substrate 1. Then, on the main surface of the semiconductor substrate 1 are laminated successively a silicon oxide film and a silicon nitride film. The silicon oxide film is formed at a temperature of about 900 to 1000° C. by the high temperature steam oxidation method. At this time, the silicon oxide film has a thickness of 40 to 50 nm or so for example. Moreover, the silicon oxide film is used as a buffer layer. The silicon nitride film is deposited by the CVD method for example and has a thickness of 80 to 120 nm or so. The silicon nitride film is used as an impurity introduction mask and an oxidation-resistant mask.

After a region (active region) in which the MOS transistor is to be formed is protected by a photoresist mask, boron ions (B+) are implanted into the unmasked region through the silicon oxide film and the silicon nitride film to form a channel stopper layer. Further, a part of the silicon nitride film which is not protected by the photoresist mask is removed and the photoresist mask is then removed. With the remaining silicon nitride film being used as the oxidation-resistant mask, the surface of the semiconductor substrate is thermally oxidized at a temperature of 900 to 1000° C. or so by the high temperature steam oxidation method to form the field insulating film 4 with about 400 to 600 nm thickness.

Next, after the remaining silicon nitride film and silicon oxide film on the surface of the active region are removed, a silicon oxide film is newly formed as the gate insulating film 43. This silicon oxide film is formed at 800 to 1000° C. or so by the steam oxidation method and has a thickness of 12 to 18 nm or so.

Thereafter, a polycrystalline silicon film (polysilicon film) to be used as the gate electrode 44 is formed over the whole surface of the substrate body including the surfaces of the gate insulating film 43 and the field insulating film 4. The polycrystalline silicon film is deposited by the CVD method and has a thickness of 200 to 300 nm. In order to decrease the resistance of the polycrystalline silicon film, the n type impurity ions, e.g., phosphorus ions (P+) are introduced into the polycrystalline silicon film by the thermal diffusion method.

Subsequently, the interlayer insulating film 47 is formed over the whole surface of the gate electrode 44. That is, the interlayer insulating film 47 is formed by the CVD method employing an inorganic silane gas and a nitrogen oxide gas as a source gas and has a thickness of 250 to 350 nm or so.

Next, the interlayer insulating film 47 and the polycrystalline film are selectively etched in this order using the predetermined etching masks to form the wirings 46a and 46b, and the gate electrode 44. Moreover, the interlayer insulating film 47 is left to remain on the gate electrode 44, and the wirings 46a and 46b.

Next, the source region and the drain region are formed. More specifically, the semiconductor substrate is implanted at 70 to 90 KeV with a dose of 1015 atoms/cm² or so using arsenic ions or phosphorus ions (As+ or P+), with the gate electrode 44, and the wirings 46a and 46b being used as the impurity introduction mask. Thereafter, the heat treatment is performed at 900 to 1000° C. for 20 to 40 min for example to diffuse the impurity ions thus implanted. Then, the interlayer insulating film 48 is formed over the whole surface of the semiconductor substrate 1. The interlayer insulating film 48 is formed by laminating a silicon oxide film and a BPSG (BoroPhospho-Silicate-Glass) film in order, and thus it has a two layer structure. The lower silicon oxide film is formed by the CVD method employing a nitrogen oxide gas as a source gas and has a thickness of 100 to 200 nm or so.

The upper BPSG film is formed by the CVD method for example and has a thickness of 250 to 350 nm or so. Since the BPSG film is liquidized by being heated at about 800° C. or more in nitrogen gas ambience, the surface of this film can be flattened.

Next, contact holes for connection are formed in the predetermined portions of the above interlayer insulating film by the anisotropic etching technique for example. Then, the wirings are formed so as to be connected to the predetermined portions of the semiconductor substrate through the contact holes, respectively. Each of the wirings is made of a metal film with a large conductivity such as a W film which is formed by the sputtering method. In this case, the wirings 46a and 46b are obtained in such a way that after the metal film is deposited over the whole surface of the interlayer insulating film 47, the metal film is patterned in the predetermined shape using the anisotropic etching technique for example.

Next, the insulating layer 48 is formed over the whole surface of the semiconductor substrate 1 including the surfaces of the wirings 46a and 46b. The insulating layer 48 is formed by laminating a silicon oxide film (deposition type insulating film) and a silicon oxide film (application type insulating film) in this order, and thus has the two layer structure. The lower silicon oxide film is deposited by the CVD method employing a tetraepoxysilane gas as a source gas and has a thickness of 250 to 350 nm or so. The upper silicon oxide film is formed to flatten the surface of the semiconductor apparatus. That is, the upper silicon oxide film is formed in such a way that the application is repeated by several times (two to five times) using the SOG method and the baking treatment (at about 450° C.) is then performed. Alternatively, the upper silicon oxide film may be replaced with an organic film such as a polyimide series resin film.

Thereafter, in the same manner as in the first embodiment of the present invention, the heat radiating portion forming holes 16 are selectively formed in the positions outside the active region by the photolithography technique.

The heat radiating portion forming holes 16 are formed so as to extend from the surface of the semiconductor apparatus 21 to the semiconductor substrate 1 by the anisotropic etching technique.

By selectively depositing the film having a large heat conductivity in each of the heat radiating portion forming holes 16, the heat radiating portions 15 can be formed so as to extend from the semiconductor substrate 1 to the surface of the semiconductor apparatus. The formation of each of the heat radiating portions 15 can be attained by means of the selective growth of the film using the selective CVD method or the laser CVD method.

Incidentally, as shown in FIG. 29, even when the heat radiating portions 15 are formed so as to extend from the semiconductor substrate 1, the same effect can be obtained.

FIG. 30 is a schematic perspective view in section showing the fifth embodiment in which the present invention is applied to the semiconductor apparatus including therein the bipolar transistor formed in the semiconductor substrate having an SOI (Silicon-on-Insulator) structure. In the semiconductor substrate having the SOI structure as shown in FIG. 30 for example, an insulating layer 51 made of an insulator is provided between the device formation region 23 and the surface of the semiconductor substrate 50. Then, in the prior art, the heat generated in the device formation region 23 having a device formed therein is mainly transferred through the insulating layer 51 and is then released to the outside of the semiconductor apparatus via the rear surface of the semiconductor substrate 50 and the lead frame.

However, since the insulating layer 51 is made of an insulator and thus has a small heat conductivity, there arises a disadvantage in that the heat is easy to remain in the device formation region 25. In the present embodiment, however, it is possible to radiate rapidly the heat generated in the device formation region 23 from the surface of the device formation region 23 using the heat radiating portions 15 each having a large heat conductivity. Therefore, since the temperature rise in the device formation region 23 can be sufficiently controlled, it is possible to improve the operational reliability of the semiconductor apparatus.

In addition to the present embodiment, an example in which the heat radiating portions 15 are formed so as to extend from the wirings 46a and 46b or the gate electrode 44 in the device formation region 23, and an example in which the heat radiating portions are formed so as to extend up to the surface of the semiconductor apparatus through the insulating layer 51 have also the same effect as in the above case.

Incidentally, the manufacturing process of the heat radiating portions 15 in the present embodiment is basically the same as those in the above first, second, third and fourth embodiments.

FIG. 31 is a schematic perspective view in section showing a sixth embodiment in which the present invention is applied to the semiconductor device having a multilayer transistor structure.

In the present embodiment, the heat radiating portions 15 are formed so as to extend from the respective device formation regions towards the surface of the semiconductor apparatus.

The present embodiment can be realized in accordance with the following manufacturing process.

First, a lower semiconductor device 52 is formed on the surface of the semiconductor substrate 1 using the means described in the fifth embodiment of the present invention. On this device is deposited a semiconductor film. Then, the irregularities of the surface of the semiconductor film is flattened by the mechanical and physical method. Subsequently, a thin semiconductor substrate is bonded to the flattened surface and the polishing is then performed to form a thin semiconductor board. Subseqeuntly, for the purpose of forming an upper semiconductor device 53 in the predetermined position of the thin semiconductor board or the semiconductor film, the deposition of various films, the etching, the ion implantation and the annealing are performed. Thereafter, the wiring is formed between the lower and upper semiconductor devices 52 and 53.

Subsequently, in order to form the heat radiating portions 15, only the predetermined portions are selectively etched away using the photolithography technique and the etching technique to partially expose the semiconductor substrate 1. Then, a film is selectively deposited on only each of the exposed portions of the semiconductor substrate 1 using the selective CVD method or the laser CVD method to form each of the heat radiating portions 15a. The provision of the heat radiating portions 15a allows the heat from the lower semiconductor device 52 to be rapidly radiated to the outside of the semiconductor apparatus. Moreover, as shown in FIG. 31, the heat radiating portions 15b are formed so as to extend from the upper semiconductor device 53. The manufacturing method of the heat radiating portions 15b is the same as that described in the fifth embodiment. The provision of the heat radiating portions 15b allows the heat from the upper semiconductor device 53 to be rapidly radiated to the outside of the semiconductor apparatus.

Moreover, in the case where the difference in the temperature between the lower and upper semiconductor devices 52 and 53 occurs due to the difference in the operational conditions therebetween, since the heat can be rapidly transferred through the heat radiating portions 15a, the difference in the temperature between the lower and upper semiconductor devices 52 and 53 is effectively cancelled.

Therefore, there occurs no difference in the electrical characteristics due to the difference in the temperature between the lower and upper semiconductor devices 52 and 53.

Figure 32:
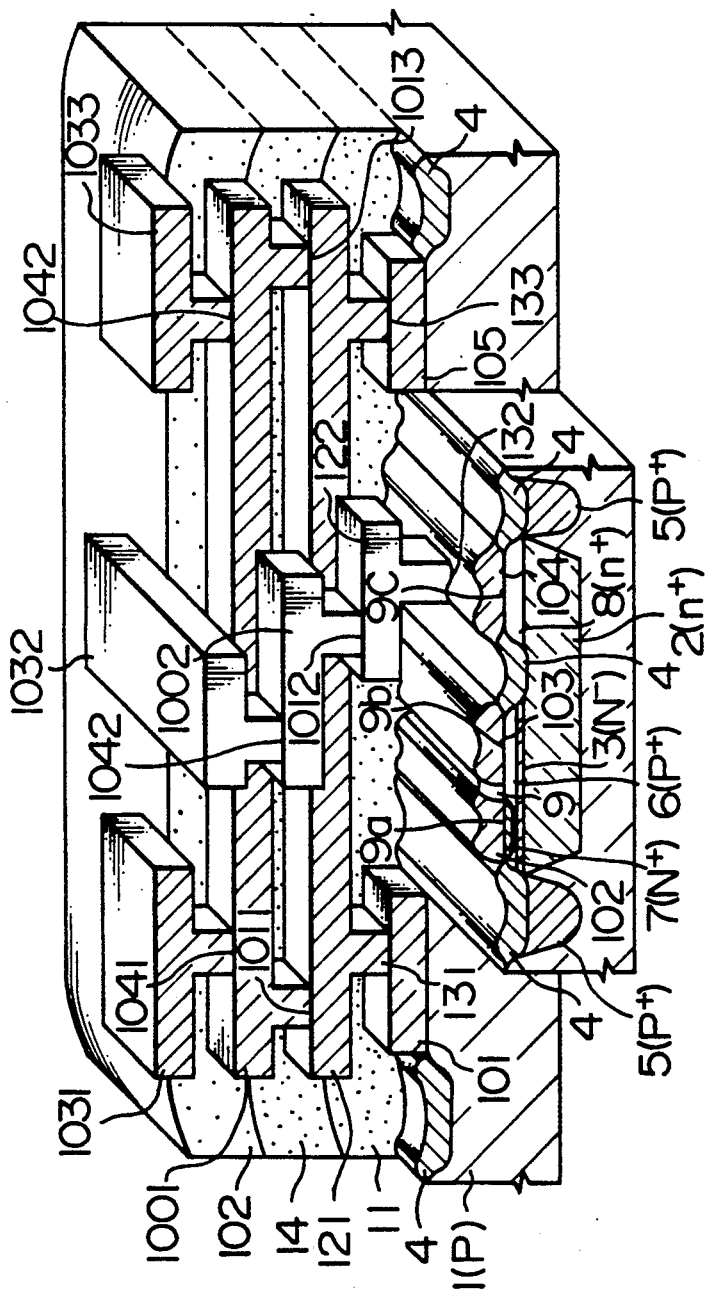
FIG. 32 and FIG. 33 are respectively schematic perspective views in section showing yet further embodiments of the present invention.

FIG. 32 is a schematic perspective view in section showing the main portions of the semiconductor apparatus 21 including therein the bipolar transistor of the sixth embodiment of the present invention.

As shown in FIG. 32, in the bipolar transistor according to the present embodiment, in the surface of the semiconductor substrate 1 such as a p type silicon substrate is formed the buried layer 2 of $n^+$ type for example, and on the surface of the semiconductor substrate 1 is formed the epitaxial layer 3 made of n type silicon for example. In the predetermined portion of the epitaxial layer 3 is formed the field insulating film 4 such as an $SiO_2$ film. Thus, the isolation, i.e., the insulating separation between devices and the insulating separation within a device is performed.

Further, under the field insulating film 4 is provided the channel stopper 5 of $p^+$ type for example. In the epitaxial layer 3 surrounded by the field insulating film 4 is formed the base region 6 of p type for example in which the emitter region 7 of $n^+$ type for example is formed.

Incidentally, the collector region is formed by the epitaxial layer 3 under the base region 6. Moreover, the reference numeral 8 designates the collector leading region of $n^+$ type for example which is connected to the buried layer 2.

Further, the reference numeral 9 designates the insulating film such as an $SiO_2$ film which is connected to the field insulating film 4 and is formed on the surface of the epitaxial layer 3. In the insulating film 9, the opening portions 9a through 9c are provided corresponding to the emitter region 7, the base region 6 and the collector leading region 8, respectively.

The reference numerals 101 through 105 designate the first level wirings each of which is made of an aluminium film for example. Out of them, the wiring 102, the wiring 103 and the wiring 104 are connected to the emitter region 7, the base region 6 and the collector leading region 8 through the opening portions 9a, the opening portions 9b and the opening portions 9c, respectively.

The wirings 101 and 105 each having no function of leading out the signals to the outside are formed near the periphery of the 2 channel stopper 5 ($P^+$).

On the wirings 101 through 105 are formed the insulating film 11 such as an $SiO_2$ film by the CVD method, a PSG (Phospho-Silicate Glass) film, or an SOG film.

On the insulating film 11 are formed the second level wirings 121 and 122 each of which is made of a conductive film such as an aluminium film. The wirings 121 and 122 are connected to the first level wirings 101 and 105, and 104 through the opening portions 131 and 133, and 132, respectively.

Further, on the second level wirings 121 and 122 is formed the insulating film 14 which is made of the same material as that of the insulating film 11. On the insulating film 14 are formed the conductive films 1001 and 1002 each of which is made of the same material as that of the wiring 12. The wirings 1001 and 1002 are connected to the wirings 121 and 122 through the opening portions 1011, 1012 and 1013, respectively.

Further, on the wirings 1001 and 1002 is formed the insulating film 102 which is made of the same material as that of the insulating film 14. On the insulating film 102 are formed the conductive films 1031, 1032 and 1033 each of which is made of the same material as that of the wiring 100. The wirings 1031 and 1033, and 1032 are connected to the wirings 1001 and 1002 through the openings 1041 and 1043, and 1042, respectively.

Moreover, the opening portions 131, 1011 and 1041 through which the wirings 101, 105, 121, 1001, 1031 and 1033 each having no function of leading out the signals are connected to one another are arranged as near one another as possible. The opening portions 133, 1013 and 1043 are arranged in the same manner as that of the above opening portions. In addition, the openings 133, 1013 and 1043 are increased in area as much as the layout permits. Moreover, the wirings each of which is arranged outside the channel stopper 5 and has no function of leading out the signals are connected to the adjacent wirings of the same type to form a network in order to enhance the radiation of the heat generated in the device.

Out of the wirings 121 and 122 thus formed, the wiring 122 is connected to the wiring 106 through the opening portion 13 board through the insulating film 11.

Further, for the purpose of providing the insulation and preventing the contamination, on the wirings 121 and 122 is formed the insulating film 14 such as an SiO$_2$ film or a PSG (Phospho-Silicate Glass) film which is formed by the CVD method.

Moreover, the heat radiating portions 15 are formed using the selective CVD method or the laser CVD method, so as to extend from the first level wirings 101 through 106 up to the surface of the semiconductor apparatus through the insulating films 11 and 14. Although the constituent material of the heat radiating portion 15 may be an insulator, a conductor or a semiconductor, a material of high heat conductivity, such as Al, Cu, Si or W, is desirable in practical use.

Moreover, it is necessary to optimize the positions of the heat radiating portions 15 so that the heat radiating portions are not in contact with the second level wirings 121 and 122.

The description will subsequently be given with respect to one example of the manufacturing method of the bipolar type semiconductor apparatus 21, according to the present embodiment, which is constructed as described above.

First, after the buried layer 2 and the channel stopper 5 are selectively formed in the surface of the semiconductor substrate 1 made of a single crystal, the epitaxial layer 3 is formed on the whole surface by the epitaxial growth method for example.

Subsequently, after the predetermined portion of the epitaxial layer 3 is removed away by the etching technique to form a plateau-like configuration, the substrate body is selectively, thermally oxidized to form the field insulating film 4. The selective film formation and the selective removal of the film by the etching can be performed using the mask formation, the following photolithography technique (photomask formation technique) and the etching technique.

The surface of the epitaxial layer 3 surrounded by the field insulating film 4 is thermally oxidized to form the insulating film 9. The field insulating film 4 or the insulating film 9 can be formed in such a way that the predetermined surface thereof is thermally oxidized at 900° to 1000° C. or so in the oxidizing ambiance.

Then, the n type impurity ions such as phosphorus ions (P+) are implanted into the epitaxial layer 3 to form the collector leading region 8.

Further, the p type impurity ions such as boron ions (B+) are implanted into the epitaxial layer 3 to form the base region 8.

Then, after the predetermined portion of the insulating film 9 is etched away to form the opening portion 9a, the n type impurity ions such as arsenic ions are selectively implanted through the opening portion 9a to form the emitter region 7.

Subsequently, after the opening portions 9b and 9c are further formed in the insulating film 9, a conductive film such as an aluminium film is deposited by the sputtering method, the CVD method or the like. Then, the aluminium film is patterned in the predetermined shape to form the wirings 101 through 106. Next, after the application type insulating film 11 such as an SOG film is applied to the whole surface, the baking is performed. Incidentally, the SOG film is formed in such a way that a liquid material which is obtained by dissolving Si-(OH)$_4$ in alcohol is applied to the surface of the substrate body to be subjected to the baking.

Moreover, a PSG film or an SiO$_2$ film formed by the CVD method may be used as the insulating film 11. After the predetermined portion of the insulating film 11 is removed by the etching technique to form the opening is deposited by the sputtering method, the CVD method or patterned to form the second level wirings 121 and 122.

Further, the insulating film 14 such as an SOG film is formed over the whole surface.

In such a manner, by using the insulating formation method, the opening portion formation method, and the wiring formation method, the manufacturing process proceeds up to the step of forming the member 104.

According to the present embodiment, there is obtained the same effects as those of the first embodiment.

What is claimed is:

1. A semiconductor apparatus comprising a semiconductor substrate; and a device including an insulating layer as a current wire lead portion, and a heat radiator straightly protruding directly from a bottom of said device towards a surface of said apparatus such that a part of said heat radiator is exposed to the outside, said device being laminated on said semiconductor substrate.

2. A semiconductor apparatus according to claim 1, wherein said semiconductor substrate comprises an SOI substrate.

3. A semiconductor apparatus according to claim 1, wherein a plurality of semiconductor devices are formed in a plurality of different layers, and heat radiators protrude respectively from the layers towards the surface of said apparatus.

4. A semiconductor apparatus comprising a semiconductor substrate; and a device including an insulating layer, a conductive layer embedded in said insulating layer, and a heat radiator straightly protruding through said insulating layer directly from said conductive layer towards a surface of said apparatus such that a part of said heat radiator is exposed to the outside, said device being laminated on said semiconductor substrate.

5. A semiconductor apparatus according to claim 4, wherein said semiconductor substrate comprises an SOI substrate.

6. A semiconductor apparatus according to claim 4, wherein a plurality of semiconductor devices are formed in a plurality of different layers and heat radiators protrude respectively from the layers towards the surface of said apparatus.

7. A semiconductor apparatus comprising a semiconductor substrate; and a device including an insulating layer, a conductive layer, formed with said insulating layer in lamination on said semiconductor substrate, and a heat radiator straightly protruding directly from said insulating layer towards a surface of said apparatus such that a part of said heat radiator is exposed to the outside.

8. A semiconductor apparatus comprising a semiconductor substrate; and a device including an insulating layer, a conductive layer, formed on said first insulating layer, a second insulating layer formed at least on said conductive layer, and a heat radiator protruding straightly through said second insulating layer directly from said first insulating layer towards an external surface of said apparatus such that a part of said heat radiator is exposed to the outside.

9. A semiconductor apparatus comprising a semiconductor substrate; and a device including an insulating layer, an electrode, a wiring layer embedded in said insulating layer, and, a seamless heat radiator protruding through said insulating layer directly from at least one of said semiconductor substrate, said wiring layer, said electrode and said insulating layer towards an external surface of said semiconductor substrate and said seamless heat radiator forming neither a current flow path nor an accumulation portion of electric charge and being characterized by a crystal axis that remains aligned between adjacent layers of said device.

10. A semiconductor apparatus comprising a semiconductor substrate; and a device including an insulating layer, an electrode, a wiring layer embedded in said insulating layer, and a seamless heat radiator protruding through said insulating layer directly from at least one of said wiring layer and said electrode towards an external surface of said semiconductor apparatus, said device being laminated on said semiconductor substrate and a part of said seamless heat radiator forming neither a current flow path nor an accumulation portion of electric charge and being characterized by a crystal axis that remains aligned between adjacent layers of said device.

11. A semiconductor apparatus comprising a semiconductor substrate; and a device including an insulating layer, an electrode, a wiring layer, and a seamless heat radiator protruding directly from at least one of said semiconductor substrate, said wiring layer and said electrode towards an external surface of said apparatus, said device being laminated on said semiconductor substrate and a part of said seamless heat radiator forming neither a current flow path nor an accumulation portion of electric charge and being characterized by a crystal axis that remains aligned between adjacent layers of said device; and a heat radiating board provided in contact with said seamless heat radiator.

12. A semiconductor apparatus according to claim 11, wherein said apparatus includes a plurality of heat radiators, and said heat radiating board is in contact with the plurality of heat radiators.

13. A semiconductor apparatus according to claim 11, wherein heat radiating fins are provided on an external surface of said heat radiation board.

14. A semiconductor apparatus comprising a semiconductor substrate; a device including an insulating layer, an electrode, a wiring layer, and a seamless heat radiator protruding directly from at least one of said semiconductor substrate, said wiring layer and said electrode towards an external surface of said apparatus, said device being laminated on said semiconductor substrate and a part of said seamless heat radiator forming neither a current path nor an accumulation portion of electric charge; and a heat radiating lead connected to said seamless heat radiator.

15. A semiconductor apparatus comprising a semiconductor substrate; and a device including an insulating layer, an electrode, a wiring layer, and a seamless heat radiator protruding directly from at least one of said semiconductor substrate, said wiring layer and said electrode towards an external surface of said apparatus, said device being formed on said semiconductor substrate by lamination, a part of said seamless heat radiator forming neither a current flow path nor an accumulation portion of electric charge and being characterized by a crystal axis that remains aligned between adjacent layers of said device, and said seamless heat radiator being connected to a mounting board.

16. A semiconductor apparatus according to claim 14, wherein said heat radiator is bonded to said mounting board through a solder bump.

17. A semiconductor package having a sealing body sealing the semiconductor apparatus according to any one of claims 1, 4 and 7, wherein, in addition to a current wire lead portion, the heat radiator is brought into contact with said sealing body.

18. A semiconductor package having a sealing body sealing the semiconductor apparatus according to claim 10, wherein said heat radiator is brought into contact with said sealing body.

19. A semiconductor package having a sealing body the semiconductor apparatus according to any one of claims 1, 4 and 7, wherein said heat radiator is in contact with said sealing body, and further a heat radiating board is provided in contact with said heat radiator.

20. A semiconductor package having a sealing body sealing the semiconductor apparatus according to any one of claims 1, 4 and 7 wherein said heat radiator is in contact with said sealing body, said heat radiator is in contact with a heat radiating lead and the heat radiating lead is in contact with a mounting board.

21. A semiconductor package having a sealing body sealing the semiconductor apparatus according to claim 10, wherein said heat radiator is in contact with said sealing body, and a heat radiating board is provided in contact with said heat radiator.

22. A semiconductor apparatus comprising a semiconductor substrate, one of a bipolar transistor and a MOS transistor laminated on said semiconductor substrate, and a heat radiator provided in addition to a current wire lead portion and straightly protruding directly from said semiconductor substrate towards a surface of said apparatus such that a part of said heat radiator is exposed to the outside.

23. A semiconductor apparatus comprising a semiconductor substrate, one of a bipolar transistor and a MOS transistor laminated on a surface of said semiconductor substrate and including a wiring layer provided as a current wire lead portion, an electrode, and a heat radiator straightly protruding directly from one of said wiring layer and said electrode towards a surface of said apparatus such that a part of said heat radiator is exposed to the outside.

24. A semiconductor apparatus according to claim 6, wherein said semiconductor substrate comprises an SOI substrate.

25. A semiconductor apparatus comprising a semiconductor substrate, one of a bipolar transistor and a MOS transistor laminated on a surface of said semiconductor substrate and including an insulating layer, and a heat radiator provided in addition to a current wire lead portion and straightly protruding directly from said insulating layer towards a surface of said apparatus such that a part of said heat radiator is exposed to the outside.

26. A semiconductor apparatus according to claim 25, wherein a plurality of semiconductor devices are formed in a plurality of different layers, and the heat radiators protrude respectively from the layers towards the surface of said apparatus.

* * * * *